US006290333B1

United States Patent
Wade et al.

(10) Patent No.: US 6,290,333 B1
(45) Date of Patent: Sep. 18, 2001

(54) MULTIPLE POWER INTERCONNECT ARRANGEMENT FOR INKJET PRINTHEAD

(75) Inventors: John M Wade, Poway, CA (US); George H Corrigan, III, Corvallis, OR (US); Glenn T Haddick, San Diego, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/429,941

(22) Filed: Oct. 29, 1999

Related U.S. Application Data

(63) Continuation-in-part of application No. 08/958,951, filed on Oct. 28, 1997, now Pat. No. 6,183,056.

(51) Int. Cl.$^7$ ........................................................... B41J 2/14
(52) U.S. Cl. ...................................................................... 347/50
(58) Field of Search .................................. 347/50, 12–19, 347/49, 40

(56) References Cited

U.S. PATENT DOCUMENTS

| | | | |
|---|---|---|---|
| Re. 36,279 | 8/1999 | Ujita | 347/86 |
| 4,490,728 | 12/1984 | Vaught et al. | 347/60 |
| 4,791,435 | 12/1988 | Smith et al. | 347/17 |
| 5,068,674 | 11/1991 | Sato et al. | 347/62 |
| 5,109,234 | 4/1992 | Otis, Jr. et al. | 347/14 |
| 5,363,134 | 11/1994 | Barbehenn et al. | 347/49 |
| 5,411,343 | 5/1995 | Childers | 400/692 |
| 5,418,558 | 5/1995 | Hock et al. | 347/14 |
| 5,428,376 | 6/1995 | Wade et al. | 347/14 |
| 5,471,163 | 11/1995 | Childers | 327/525 |
| 5,473,351 | 12/1995 | Helterline et al. | 347/19 |
| 5,475,405 | 12/1995 | Widder et al. | 347/14 |
| 5,497,174 | 3/1996 | Stephany et al. | 347/13 |
| 5,521,620 | 5/1996 | Becerra et al. | 347/14 |
| 5,526,027 | 6/1996 | Wade et al. | 347/14 |
| 5,541,629 | 7/1996 | Saunders et al. | 347/12 |
| 5,610,642 | 3/1997 | Nobel et al. | 347/50 |
| 5,642,142 | 6/1997 | Bohorquez | 347/15 |
| 5,644,342 * | 7/1997 | Argyres | 347/12 |
| 5,648,804 | 7/1997 | Keefe et al. | 347/47 |
| 5,677,577 | 10/1997 | Barbehenn et al. | 307/98 |
| 5,682,185 | 10/1997 | Wade et al. | 347/19 |
| 5,706,040 | 1/1998 | Reid et al. | 347/50 |
| 5,751,302 | 5/1998 | Rezanka | 347/9 |
| 5,754,193 | 5/1998 | Elhatem | 347/12 |
| 6,039,428 * | 3/2000 | Juve | 347/19 |
| 6,183,056 * | 2/2001 | Corrigan et al. | 347/14 |
| 6,183,078 * | 2/2001 | Pietrzyk et al. | 347/92 |
| 6,193,347 * | 2/2001 | Askeland et al. | 347/15 |

FOREIGN PATENT DOCUMENTS

| | | |
|---|---|---|
| 60-206664 | 10/1985 | (JP) . |
| 61-197247 | 9/1986 | (JP) . |

* cited by examiner

*Primary Examiner*—N. Le
*Assistant Examiner*—Michael Nghiem
(74) *Attorney, Agent, or Firm*—Robert C. Sismilich

(57) ABSTRACT

An interconnection arrangement for an inkjet printing system having multiple power pads, each of which provides power for driving a large number of printhead ink ejection elements. The ink ejection elements of a print cartridge are organized into groups, with power provided to each group by one of the power pads. The firing pulse width of each group is independently set to compensate for the parasitic electrical resistances in the power path of each ink ejection group in the print cartridge so as to eject ink drops of uniform volume required for high quality printed output. In order to transmit the relatively high current levels required to fire a large number of ink ejection elements from a single group at the same time, the interconnection scheme provides multiple bump-and-dimple interconnections with the printer for each power and ground pad on the print cartridge.

19 Claims, 13 Drawing Sheets

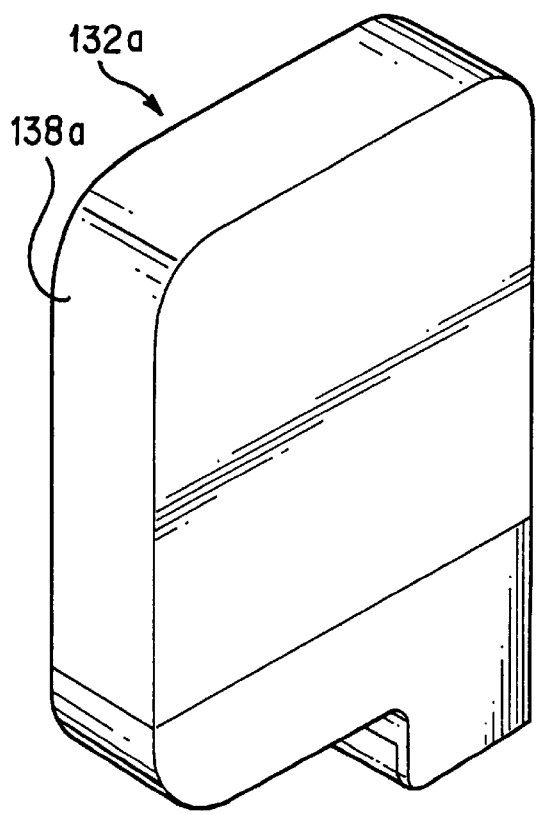
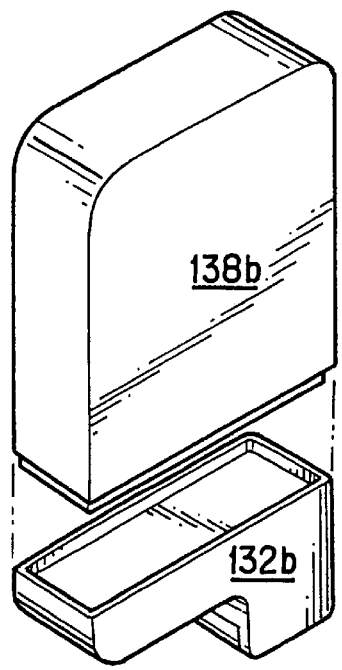
FIG. 10A
FIG. 10B
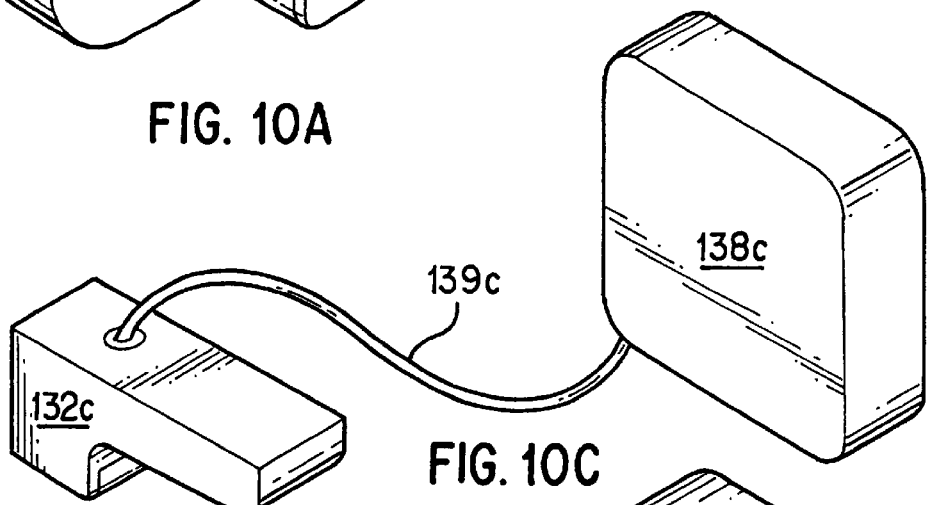
FIG. 10C
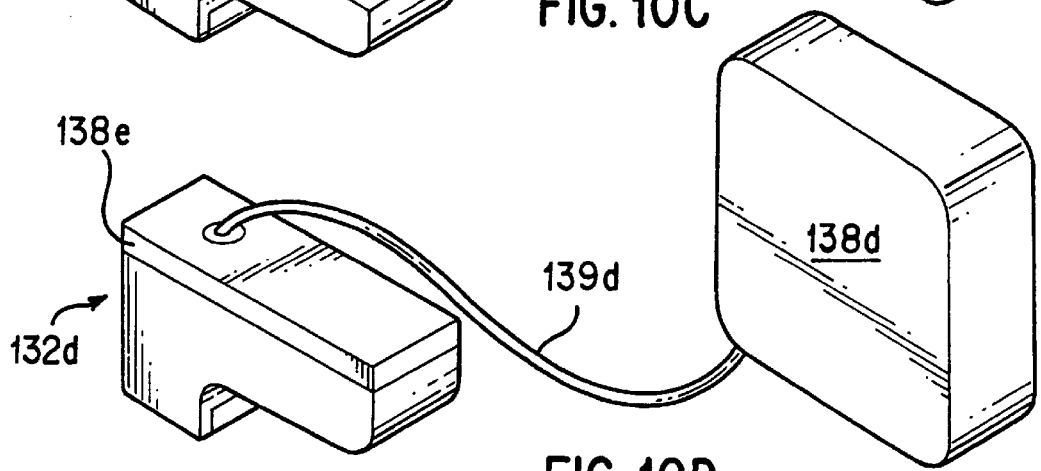
FIG. 10D

MULTIPLE POWER INTERCONNECT ARRANGEMENT FOR INKJET PRINTHEAD

CROSS-REFERENCE TO RELATED APPLICATIONS

This application is a continuation-in-part of the co-pending U.S. application Ser. No. 08/958,951, by Corrigan et al., filed Oct. 28, 1997, titled "Thermal Ink Jet Print Head and Printer Energy Control Apparatus and Method", now U.S. Pat. No. 6,183,056. This application also relates to the subject matter disclosed in the co-pending U.S. application Ser. No. 09/016,478, by Askeland et al., filed Jan. 30, 1998, entitled "Hybrid Multi-Drop/Multi-Pass Printing System" now U.S. Pat. No. 6,193,347; the co-pending U.S. application Ser. No. 08/962,031, by Courian et al., filed Oct. 31, 1997, entitled "Ink Delivery System for High Speed Printing" now U.S. Pat. No. 6,183,078; the co-pending U.S. application Ser. No. 09/071,138, by Wade, filed Apr., 30, 1998, titled "Energy Control Method for an Inkjet Print Cartridge"; the co-pending U.S. application Ser. No. 09/183,949, by Holstun et al., filed Oct. 31, 1998, titled "Varying the Operating Energy Applied to an Inkjet Print Cartridge Based Upon the Operating Conditions"; the co-pending U.S. application Ser. No. 09/253,441, by Barbour et al., filed Feb. 19, 1999, titled "A High Performance Printing System and Protocol"; the co-pending U.S. application Ser. No. 09/496,136 by Haddick, filed concurrently herewith, titled "Reliable Space-Efficient Printer Pen Flex Circuit"; and the co-pending U.S. application Ser. No. 09/429,942, by Corrigan et al., filed concurrently herewith, titled "Independent Power Supplies for Color Inkjet Printers". All of the above-referenced applications are assigned to the assignee of the present invention and hereby incorporated by reference in their entirety.

FIELD OF THE INVENTION

The present invention relates generally to thermal ink jet printers, and more particularly to the supplying of power signals to the ink ejection elements of thermal ink jet printers.

BACKGROUND & SUMMARY OF THE INVENTION

Inkjet hardcopy devices, and thermal inkjet hardcopy devices such as printers, plotters, facsimile machines, copiers, and all-in-one devices which incorporate one or more of these functions in particular, have come into widespread use in businesses and homes because of their low cost, high print quality, and color printing capability. These hardcopy devices are described by W. J. Lloyd and H. T. Taub in "Ink Jet Devices," Chapter 13 of *Output Hardcopy Devices* (Ed. R. C. Durbeck and S. Sherr, San Diego: Academic Press, 1988). The basics of this technology are further disclosed in various articles in several editions of the *Hewlett-Packard Journal* [Vol. 36, No. 5 (May 1985), Vol. 39, No. 4 (August 1988), Vol. 39, No. 5 (October 1988), Vol. 43, No. 4 (August 1992), Vol. 43, No. 6 (December 1992) and Vol. 45, No. 1 (February 1994)], incorporated herein by reference.

The operation of such printers is relatively straightforward. In this regard, drops of a colored ink are emitted onto the print media such as paper or transparency film during a printing operation, in response to commands electronically transmitted to the printhead. These drops of ink combine on the print media to form the text and images perceived by the human eye. Inkjet printers may use a number of different ink colors. One or more printheads (also sometimes referred to as "pens") may be contained in a print cartridge, which may either contain the supply of ink for each printhead or be connected to an ink supply located off-cartridge. An inkjet printer frequently can accommodate two to four print cartridges. The cartridges typically are mounted side-by-side in a carriage which scans the cartridges back and forth within the printer in a forward and a rearward direction above the media during printing such that the cartridges move sequentially over given locations, called pixels, arranged in a row and column format on the media which is to be printed. Each print cartridge typically has an arrangement of individually controllable printhead ink ejection elements for controllably ejecting the ink onto the print media, and thus a certain width of the media corresponding to the layout of the ink ejection elements on the print cartridge, can be printed during each scan, forming a printed swath. The printer also has a print medium advance mechanism which moves the media relative to the printheads in a direction generally perpendicular to the movement of the carriage so that, by combining scans of the print cartridges back and forth across the media with the advance of the media relative to the printheads, ink can be deposited on the entire printable area of the media.

Each ink ejection element, or firing unit, includes an ink chamber connected to a common ink source, and to an ink outlet nozzle. A transducer within the chamber provides the impetus for expelling ink droplets through the nozzles. In thermal ink jet printers, the transducers are thin film firing resistors that generate sufficient heat during application of a brief voltage pulse to vaporize a quantity of ink sufficient to expel a liquid droplet.

A power source supplies electrical power (a certain amount of current at a certain voltage) to the firing resistors in the ink ejection elements in order to provide the electrical energy required to fire ink drops from the elements. The energy applied to a firing resistor affects performance, durability, and efficiency. It is well known that the firing energy must be above a certain threshold to cause a vapor bubble large enough to expel a drop to nucleate. Above this threshold is a transitional range, in which increasing the energy increases the drop volume expelled. Above a higher threshold at the upper limit of the transitional range, drop volumes do not increase with increasing energy. It is in this upper range in which drop volumes are stable even with moderate energy variations that printing ideally takes place, because the variations in drop volume that cause disuniformities in printed output can be avoided when operating in the upper range. As energy levels increase above this optimal zone, uniformity is not compromised, but rather energy is wasted resulting in excessive temperature rise, and the printer components are prematurely aged due to excessive heating and ink residue build up.

In existing systems having a dedicated connection for each firing resistor, a one time calibration of each connection by printer or production circuitry external to the pen also compensates for any parasitic resistance or impedance in the unique path leading to each resistor. Printheads may be characterized at production to set these operating parameters. In addition, because each interconnection pad was only required to carry enough current to fire a single resistor, the area of the pad needs to be only large enough to support a single contact point with the printer electronics.

However, in highly multiplexed print heads having different sets or groups of nozzles, each set addressed by a common voltage line, there may be variations due to other factors. Each set or group of nozzles is powered by a single voltage line that receives power via an electrical contact pad between the printer electronics and the removable print cartridge. This line continues on a flex circuit to a tab bonding connection to the printhead die having other electronics, including the firing resistors. The impedance of the print cartridge contact pads, tab bonding connections, and the flex circuit trace connections in between can vary from cartridge to cartridge, from nozzle to nozzle, and over time for a given cartridge, even when the voltage provided by the printer to each of the cartridge contacts is well controlled. Consequently, as printed data changes, the current drawn through the line and the voltage as measured at the print cartridge terminals may be undesirably varied. For instance, when many or all nozzles are fired simultaneously, the voltage may be depressed by parasitic effects, giving a lower firing energy than when only one or a few nozzles are fired. In the past, however, the power and ground interconnect pads were intermixed with the logic signal pads without sufficient consideration of the voltage variances that might result during printing. Accordingly, there is still a need for a thermal inkjet printer using these new, highly multiplexed printheads that effectively compensates for the voltage variations due to parasitic resistance in order to provide uniform ink drop volumes yielding printed output of high quality.

In a preferred embodiment, the present invention provides a multipass inkjet printing system having modulated firing pulses that produce uniform ink drop volumes from print cartridges which have a large number of ink ejection elements. The die which includes the ink ejection elements has multiple power bond pads for receiving the power signals which control the operation of the ink ejection elements. A flex circuit has power interconnect pads electrically connected to power tab leads which in turn are electrically connected to the power bond pads of the die. A power source detachably connected to the power interconnect pads supplies the power signals to the printhead die. Energy management circuitry adjusts the firing energy delivered to the ink ejection elements to produce the desired uniform drop volumes.

Typically, the ink ejection elements are organized into groups, with at least some of the ink ejection elements in each group selectively actuated by a different one of the firing pulses. A preferred embodiment has four groups and four independently-controlled firing pulses from four independent energy management circuits. The flex circuit may also have one or more ground interconnect pads electrically connected to ground tab leads which in turn are electrically connected to the ground interconnect of the die for carrying return current for the power signals. In order to minimize to parasitic resistances internal to the printing system, the power and ground interconnect pads are typically located in a region closer to the printhead die than other pads for logic signals. The electrical connections between the pads and the tab leads on the flex circuit preferentially are conductive traces. Typically the flex circuit is attached to a surface of the print cartridge. Each of the power and ground interconnect pads has at least one contact point through which current is supplied by the printer, but in order to supply amounts of current in excess of what a single contact point can accommodate, at least some of the pads have at least two contact points. Pads which have at least two contact points allow improved calibration of the printhead, since current can be supplying during calibration through one contact point, and the voltage drop due to the internal resistance of the flex circuit and the printhead die can be more accurately sensed through another contact point on the same pad. The power tab leads arc preferentially spaced around the periphery of the printhead die; in a preferred embodiment having a rectangular die and four ink ejection element groups, the four power tab leads are located at the corresponding four corners of the die, and two ground tab leads are located between the two power tab leads on the shorter sides of the die.

Another embodiment of the present invention includes an interconnect circuit for distributing the power signals to the ink ejection elements. The circuit has a flex circuit on which electrically conductive interconnect pads are fabricated, each pad for carrying one of power or ground signals, with electrically conductive elongated traces also fabricated on the flex circuit for connecting at a different location to the ink ejection elements. The flex circuit preferentially also contains an isolation trace (also sometimes referred to as a "squish" trace) located in between two of the power traces in order to electrically isolate the power signals carried on the power traces from each other. One or more punched holes injunction regions of at least two isolation traces isolate the isolation traces each others and from connection to any of the pads.

The present invention may also be implemented as a method of supplying power to a printhead having multiple ink ejection elements. The pulse widths of at least two firing pulses are independently modulated and transmitted to the ink ejection elements to controllably eject ink drops of uniform drop volume. Each firing pulse is preferentially connected to more than one ink ejection element, with only one firing pulse being connected to any individual element. Typically the ink ejection elements are divided into groups, with a separate firing pulse being connected to each group. The ink may be provided to the ink ejection elements from an on-carriage reservoir contained in a print cartridge housing the printhead, from an off-carriage reservoir fluidly connected to the printhead, or from an on-carriage reservoir removably attached to a print cartridge housing the printhead. The voltage level required for the firing pulses is determined during a calibration operation including measuring the internal resistances of the printhead.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 10A–10D are schematic representations of alternative printhead and ink reservoir configurations usable with the printer of FIG. 1.

DESCRIPTION OF THE PREFERRED EMBODIMENTS

Figure 1:
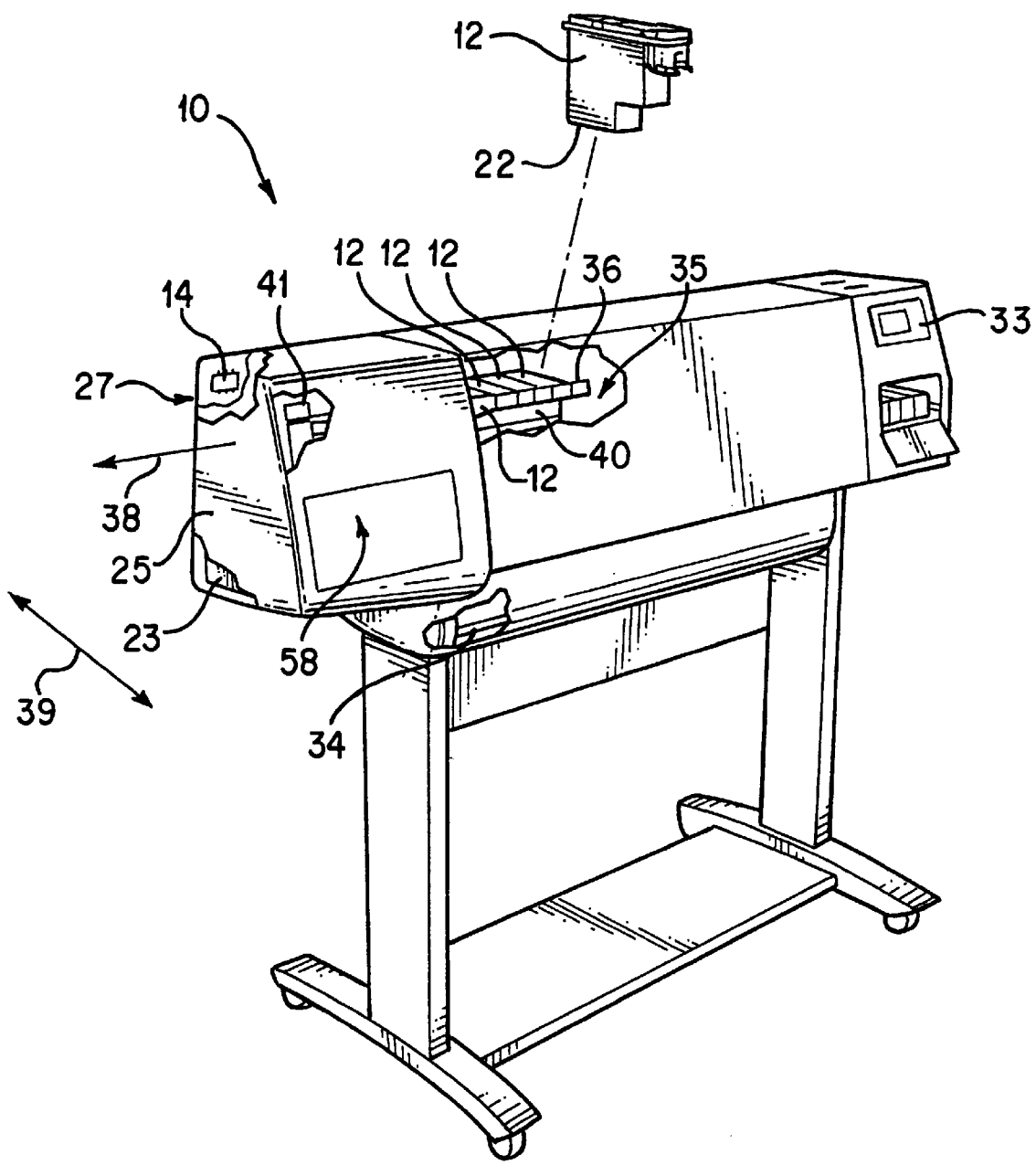
FIG. 1 is a perspective view of an inkjet printer embodying the present invention.

Referring now to the drawings, and more particularly to FIG. 1, there is illustrated a perspective view of printing system 10 embodying the present invention which deposits uniform ink drop volumes on all portions of the printed media so as ensure high quality printed output. While it is apparent to those skilled in the art that exact printer components may vary of model to model, the inkjet printing system 10 includes a chassis 23 surrounded by a housing 25 forming a print assembly portion 27 of the printer 10. The printer 10 has a print controller 14 that receives instructions from a host device (not shown), typically a computer. The print controller 14 may also operate in response to user inputs provided through a keypad and status display portion 33 located on the exterior of the housing 24. A monitor (not shown) coupled to the computer may also be used to display visual information to an operator, such as the printer status or the user interface of an applications program being run on the computer. Computers and input devices, such as keyboards and pointing devices, are all well known in the art.

A carriage guide rod 36 is mounted to the chassis 22 to define a scanning axis 38, with the guide rod 36 slideably supporting a carriage 40 for relative motion with the media. A conventional carriage drive motor 41 may be used to propel the carriage 40 in response to a control signal from the controller 14, and a conventional positional feedback mechanism (not shown) communicates the present carriage position to the controller (not shown). A conventional print media handling system (not shown) may be used to advance a continuous sheet of print media 34, such as paper or transparencies, from a roll through a printzone 35 and along a media advance axis 39 substantially orthogonal to the scanning axis 38. Alternatively, a sheet feed mechanism (not shown) may perform the same function for flat sheet media.

In the printzone 35, the media receives drops of ink from a print cartridge 12. One or more print cartridges 12 are removably mounted in the carriage 40. Each print cartridge 12 contains a pigment-based or dye-based ink. Each print cartridge 12 may contain an ink of a different color; typically, black, cyan, magenta, and yellow inks are utilized. It is apparent that other colors or types of inks, such as paraffin-based inks or hybrid inks having both dye and pigment characteristics, may be used in the print cartridge 12 without departing from the scope of the present invention. Each print cartridge 12 contains a printhead die 22 having ink ejection elements. The print cartridge 12 and the printhead die 22 will be discussed hereinafter in greater detail.

The printing system 10 uses an off-carriage ink delivery system, having main stationary ink reservoirs (not shown) for each color ink located in an ink supply region 58. In this off-carriage system, the supply of ink in the print cartridges 12 are replenished by ink conveyed through a conventional flexible tubing system (not shown) connecting the stationary reservoirs to the cartridges. Consequently, only a small amount of ink is included in the cartridges propelled by the carriage 40 across the printzone 35. Alternative ink delivery systems usable with the present invention will be discussed subsequently.

Figure 2A:
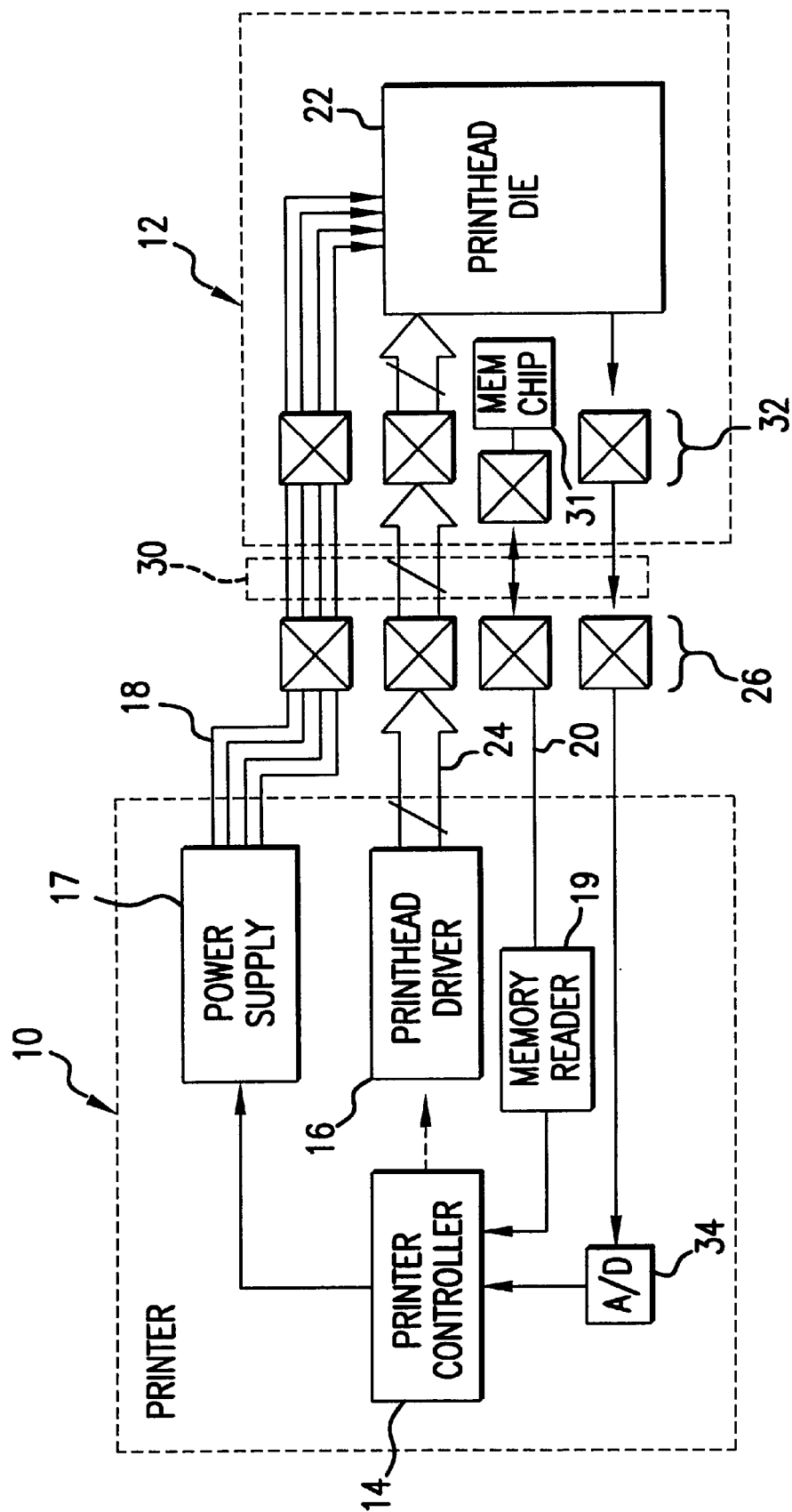
FIG. 2A is a schematic block diagram of an early embodiment of the present invention usable in the inkjet printer of FIG. 1.

Considering now an early embodiment of the present invention, FIG. 2A shows a schematic block diagram of an ink jet printer 10 with a connected print cartridge 12. A controller 14 in the printer receives print data from a computer or microprocessor (not shown) and processes the data to provide printer control information or image data to a print head driver circuit 16. A controlled voltage power supply 17 provides to a four line power bus 18 a controlled supply voltage. A memory reader circuit 19 in the printer is connected to the controller for transmitting information received from the print cartridge 12 via a memory line 20. The print head driver circuit is controlled by the controller to send the image data to a print head die 22 on the print cartridge 12, via a control bus 24 that has about twenty lines. The memory circuit 19 may also include writing capability.

The cartridge is removably replaceable, and is electrically connected to the printer by the control bus 24, power bus 18, memory line 20 and thermal data line to be discussed below. A connector interface 26 has a conductive pin for each line on the printer side contacting a corresponding pad on a flexible circuit 30 on the cartridge 12. A memory chip 31 on the cartridge stores printer control information programmed at production of the cartridge, or by the printer during use. The flex circuit 30 is connected to the print head die 22 via tab bonds 32. An analog-to-digital converter 34 in the printer is connected to the print head to receive data from the print head that indicates the print head's temperature.

The print head has 524 nozzles, each with an associated firing resistor. The print head is arranged into four similar quadrants, each having eight "primitives" of 16 nozzles each, plus four primitives of three nozzles each. To provide a multiplexed function requiring only a limited number of lines between the printer and print head, resistor current flows through a voltage line and a ground line shared by other resistors in its quadrant. The resistors are individually addressable to provide unlimited pattern permutations, by a serial data stream fed from the print head.

Figure 2B:
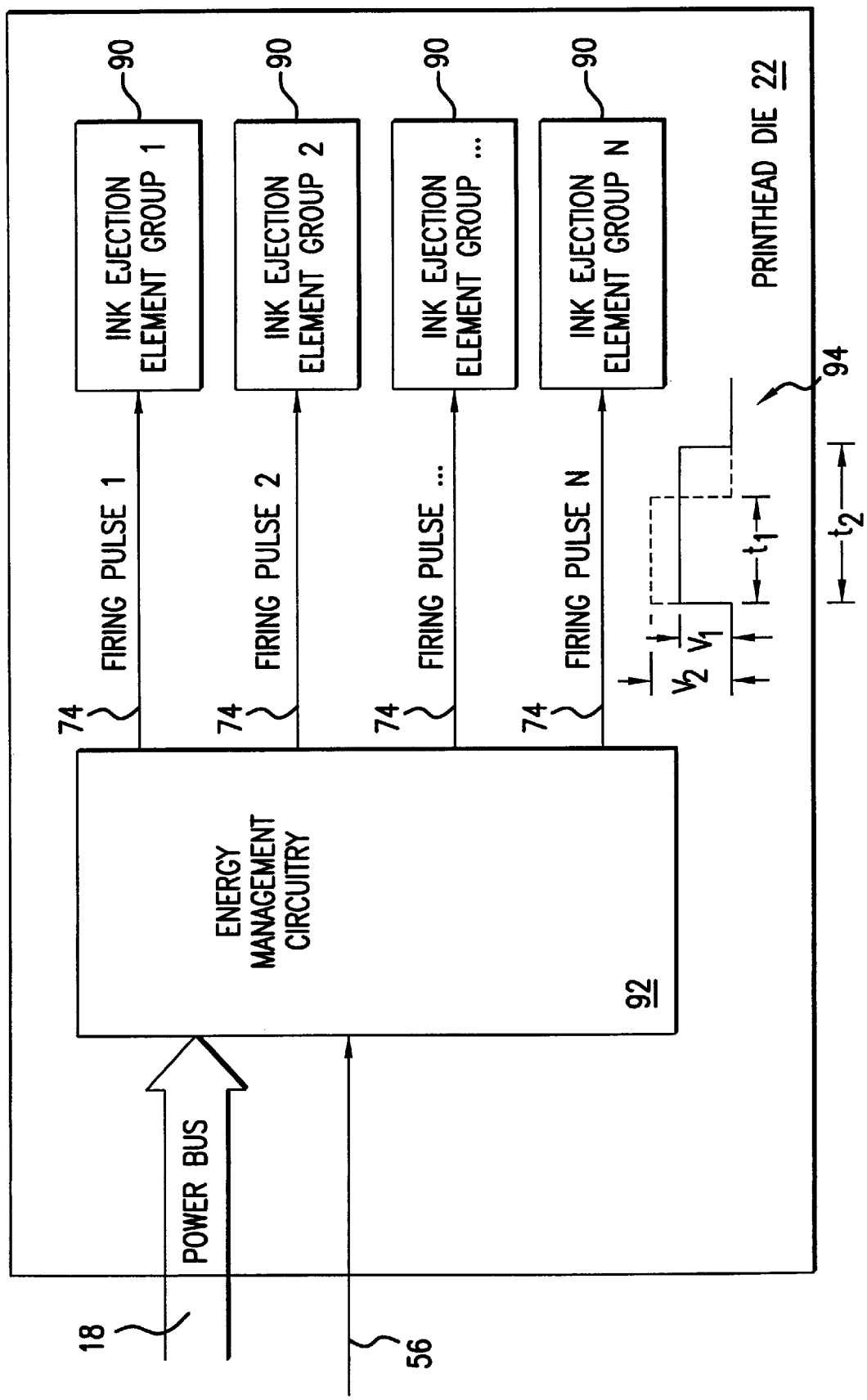
FIG. 2B is a more detailed block diagram of the printhead die of FIG. 2A

Considering now in further detail certain aspects of the printhead die 22 with reference to FIGS. 1 and 2B, ink ejection elements are organized into groups 90. Each group 90 can contain a different number of ink ejection elements, and elements can belong to one or more groups 90. In a preferred embodiment, each element belongs to only a single group 90, and each group 90 has a substantially equal number of elements. The printhead die 22 also includes an energy management circuit 92. A power bus 18 supplying a voltage Vpp and a firing line 56 are inputs to the energy management circuit 92. The energy management circuit 92 produces firing pulses 94 on output lines 74 connected to each of the groups 90. By applying a voltage V for a time T, the firing pulses 94 supply the ink ejection elements with the amount of energy required to eject the ink. In order to compensate for parasitic resistances in the printing system so as to produce uniform drop volumes from all ink ejection elements, and as will be discussed hereinafter in further detail, the energy management circuit 92 can modulate the time T.

Figure 3:
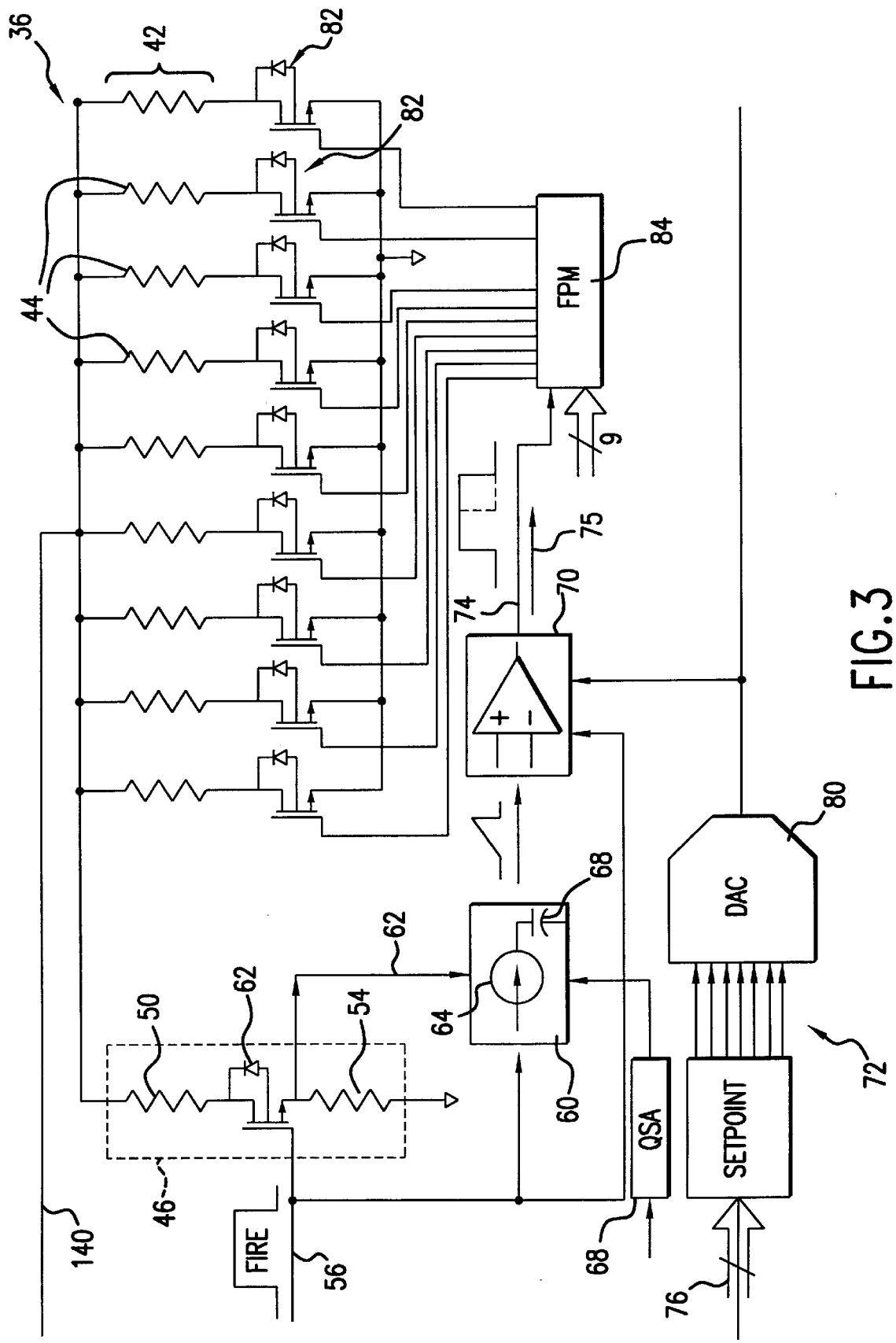
FIG. 3 is a schematic circuit diagram of a portion of the printhead die of FIG. 2A.

Considering now in further detail a preferred embodiment of the energy management circuit 92 that modulates firing energy by varying T, FIG. 3 shows a firing and energy control circuit 36 of a representative quadrant of the die, and showing an exemplary fraction of the many resistors of the quadrant (an nth one of the sixteen of the full primitive.) The circuit 36 resides on the print head die and has a single voltage input line (Vpp) 140 from the power bus 18 commonly connected to a set 42 of thin film firing resistors 44, each preferably 28 ohms. A voltage sensing network 46 includes a high value resistor 50 having ten times the resistance (280 ohms) of any of the firing resistors, and connected to the input line 140 at the same node as the firing resistors. The sensing network further includes a LDMOS switch 52 having an input connected to the resistor 50, an output connected to a sense resistor 54 having a low value (10 ohms) relative to the firing resistors, and a control line connected to a firing line 56 from the printer. The sense resistor is connected to ground.

A voltage-to-power converter circuit 60 has a primary input line 62 connected between the switch 52 and sense resistor 54. A firing input is connected to the firing line 56, so that a pulse on the firing line triggers the converter's operation. The converter includes a bias current generator 64 and an integration capacitor 66. A voltage provided to the converter is converted to a power signal, which is used to generate a bias current that is fed to the integration capacitor, creating an output voltage that is proportional to energy. A quadrant slope adjuster (QSA) circuit 68 has an output connected to the converter circuit to adjust its rate of output voltage increase, or output slope, stored in the QSA register, having been loaded from the printer controller, this data having been received from the memory chip. In the preferred embodiment, each QSA provides a +/-5% adjustment in the slope, so that small variations in performance and energy requirements among the quadrants may be controlled and compensated for. Each quadrant has its own such QSA, so that each may be adjusted slightly. A wider adjustment range may be implemented where desired. In another embodiment, each QSA provides a four setpoint adjustment in the slope, preferably in 5% energy steps.

A pulse width control block 70 includes logic for pulse width truncation and a continuous-time voltage comparator has a first input connected to the output of the converter 60 (which transmits the energy signal), a second input connected to the output of a DAC 80, which is in turn controlled by a setpoint voltage reference device 72, and a control line connected to the firing line 56. The control block's comparator has an output line 74 that transmits a voltage pulse, which is initiated upon triggering by a pulse on the firing line, and terminated when the output of the converter 60 equals the output of the converter 80, or when the fire pulse terminates, whichever occurs first. A truncation detect signal on a second comparator output line 75 provides status information to control logic circuitry indicating that the circuit has truncated the fire pulse. This signal is used for calibration purposes.

The setpoint reference voltage device 72 includes a 7-line bus 76 connected to an internal register loaded by the printer, and a 7-bit digital-to-analog-converter (DAC) 80 connected to convert a digitally encoded voltage value received from the printer to a reference voltage output. The converter 80 has an output voltage that allows a delivered energy range of 1 microJoule to 7 microJoules. In the preferred version of the early embodiment, the converter 80 is a precision poly resistor string combined with an analog switch matrix.

Each firing resistor 44 is connected to a corresponding firing switch 82 connected to a ground line, and having a control input connected to the output of a fire pulse modulator 84. The fire pulse modulator receives print data on a 9 bit bus, and outputs a firing signal to each selected firing switch.

In operation, the system is calibrated as discussed below to set a Vpp level adequate to ensure adequate firing energy levels for full drop volume firing in "blackout conditions" when all resistors are fired simultaneously. Because firing energy is proportional to the product of the square of the voltage and the time duration, Vpp must be high enough to provide adequate energy within the limited time afforded for printing each dot, before the next dot is to be printed at the desired printer scan rate. Part of the calibration process includes establishing a setpoint voltage to provide a limited firing energy threshold for all firing condition, regardless of the number of nozzles fired simultaneously.

To fire a selected group of the resistor set 42, the printer sends a voltage Vpp on line 140, and transmits a full-duration firing pulse on line 56. In response to the firing pulse, the comparator transmits the firing pulse to the resistor firing switches 82, causing the selected switches to close, connecting the resistors to ground for current flow to generate firing energy. Also in response to initiation of the firing pulse on line 56, the switch 52 opens, allowing a small current to flow through resistors 50 and 54, with the voltage between the resistors on line 62 being proportional to the Vpp on line 140 as affected by the current drawn by the activated resistors.

The firing pulse also triggers the converter circuit 60 to reset the capacitor to zero, zeroing the output voltage. The input voltage is converted to a power signal by conventional analog circuitry. The power signal is then used to generate a bias current that is fed into the integration capacitor 66, creating an output voltage ramp with a slope proportional to the energy dissipated during the pulse. The rate of voltage rise is further modified based on the stored data in the quadrant slope adjustment circuit 68, which has been based on initial manufacturing calibrations discussed below.

When the output voltage reaches a preselected setpoint voltage determined experimentally at operational calibration (as will be discussed below,) the comparator of control block 70 terminates the pulse transmitted on line 74 to the firing resistors. In this process, when Vpp is higher due only to a limited number of resistors being selected for firing, the voltage at line 62 will be higher, and the rate of charging of the capacitor will be increased. Consequently, the pulse will be terminated after a shorter duration to maintain a consistent energy delivered. In the event that Vpp drops below the point determined during calibration, and the capacitor voltage does not reach the setpoint before the printer firing pulse ends, the printer fire pulse will override the comparator and terminate energy delivery. It is possible to compensate for such low Vpp conditions by lengthening the firing pulse slightly after calibration, as long as the requirements of pen frequency and printing speed are not violated.

To operationally calibrate an installed print head cartridge to compensate for parasitic resistances in the printer and the printer-to-cartridge connection, Vpp is set by the printer to a default value based on a test operation in which nozzles are fired one quadrant at a time to generate the worst case possible parasitic voltage drops at the input lines for each of the sets of resistors across all of the primitives at its maximum firing frequency. For a quadrant having nine firing resistors 44 for ink ejection elements, and thus nine sets of parasitic resistances, the parasitic voltage drop can vary by a factor of up to 9:1 depending on the number of firing resistors 44 selectively actuated during a printing interval.

As the printer must have adequately fast throughput and carriage scan speed, the voltage is set with a firing pulse somewhat briefer than the desired time between pulses (i.e. less than [scan speed/dot pitch]+margin). With this nominal maximum pulse duration, the default voltage is set to ensure that all nozzles are firing fully, above the transitional range discussed in the background of the invention. The determination of proper firing and function above the transitional range is conducted by means well known in the field of thermal ink jet printing.

With a default Vpp established, an energy calibration mode is enabled. In this mode, the energy control circuitry, including the sense network 46, converter 64, and control block 70 are activated. The printer again delivers signals to generate firing from all nozzles of all primitives with the setpoint voltage set at a relatively high initial level Vs1 to provide a high firing energy well beyond the transitional range. This process is repeated at sequentially lower setpoint voltages Vs2, Vs3, etc. until the onset of pulse width truncation indicates that an optimum firing energy level has been reached. This is achieved by firing a pulse at nominal voltage, then checking a truncation status bit indicating whether a pulse was properly fired, then lowering the voltage by a small increment, and repeating the process. During this calibration process, the status bit is set when the firing pulse is still high or active when the comparator trips. If the firing pulse drops or terminates before the comparator trips, the status bit is not set. When the voltage is at a low enough level, firing will not occur, and conventional printer drop sensing circuitry, which may include optical drop detectors, will set the status bit to a state indicating non-firing. The setpoint voltage is set above this non-firing voltage by a margin of safety to ensure firing. Preferably, the setpoint voltage is set so that the firing pulse duration is no longer than 2 microseconds, to avoid reliability problems associated with longer duration low voltage pulses. Such reliability problems arise when a too-high power is applied during a short duration to obtain the needed energy. Such extreme power creates high rates of temperature change in the resistors, which generates potentially damaging stresses. Optionally, the operational calibration process may continue until a sufficiently low setpoint is reached so that all quadrants are experiencing pulse truncation, thereby ensuring that none of the quadrants are firing at higher than needed energy levels. Ensuring truncation throughout the system also provides a margin for pulse expansion in unexpectedly low Vpp conditions.

Prior to delivery and use, the pen undergoes a one-time factory calibration process to compensate for quadrant-to quadrant variations within the pen cartridge. in pen resistors and internal trace resistances. Although the resistances in the printer, and in the power connections between the printer carriage and the pen tend to differ from printer to printer, and with different installations of the same pen in the same printer, the variations internal to a given pen are best identified and compensated for as an end manufacturing process. Internal pen variables include pen flex circuit power and ground line resistance, flex circuit-to-die tab bond resistance, die traces connecting each quadrant to power and to ground, and semiconductor process and resistor variations. Compensating for these variables at manufacturing minimizes the diagnostic circuitry requirements of the printer, and limits calibration delays upon pen installation by the user.

Factory calibration serves to identify the operational differences between the four functional quadrants of the print head die, in particular the different resistances in the traces and connections for each different quadrant. Also, the resistor dimensions may vary within tolerances, and these variations may tend to be consistent within each quadrant, and different between quadrants. In addition, the semiconductor manufacturing process may generate variations that are minimal within each quadrant, but which create variations within each die, from quadrant to quadrant.

Calibration of the print head is made at an energy level somewhat in excess of the nominal firing energy, so that any unexpected resistances, such as caused by a marginally poor cartridge-to-printer connection, may be compensated for. This also ensures that the printhead is operated in an area where drop weight is independent of pulse energy. The nominally excessive energy is compensated for by the pulse width truncation approach discussed above. In the early embodiment, an "over energy" level of 20%, or 1.2 times nominal, is selected. In a later embodiment, an "over energy" level of at least 15%, or 1.15 times nominal, is selected.

Initially, with the energy compensation circuit turned off (so that truncation does not occur), the pulse width is set to 2.0 msec, a maximum nominal pulse width. At this pulse width, each quadrant of the pen is separately operated with all of its nozzles firing, with the other three quadrants inactive. The turn on voltage of each quadrant is determined, and the quadrant with the highest turn on voltage Vh is identified.

Factory calibration continues by turning on the energy compensation circuit. The QSA 68 in the highest voltage quadrant (with voltage Vh) is set at the maximum +5% by manufacturing circuitry connected to the cartridge by the standard printer connections. The voltage Vpp on the power line to the high quadrant is set at Vpp=Vh$\sqrt{1.2}$ (the 1.2 being based, for the early embodiment, on the desired "over energy" level of 1.2 times nominal.) While firing all the resistors of this quadrant only, the DAC 80 is adjusted in a binary search mode until the pulse width for the quadrant begins to truncate, that is, at the lowest voltage level at which truncation occurs. The QSA value of +5%, and the determined DAC setting are written to the memory chip 31 by the external manufacturing circuitry.

The remaining quadrants are calibrated one at a time, firing all resistors of the quadrant "x" to determine a turn on voltage Vx. Using the DAC setting established in calibrating the first "Vh" quadrant, the input Vpp is then set at Vpp= Vx$\sqrt{1.2}$, and the QSA is adjusted by a binary descent mode until the pulse width for that quadrant just truncates. The QSA setting for this quadrant is written to the memory chip, and the process is repeated for each quadrant. Following manufacturing calibration, the memory chip contains a single DAC setting, and four independent QSA settings, one for each quadrant.

Factory calibration includes storing a nominal operating voltage Vop, which is used to enable the printer in which the pen is eventually installed to determine whether there are intolerably high parasitic resistances that were not detectable in the pen alone during factory calibration. Such resistances might occur with a printer wiring fault, or a poor conduction at the pen-printer contacts. If a high resistance were encountered, the system circuitry would compensate with a higher input voltage Vpp. This is acceptable up to a point, but a high Vpp needed to overcome resistance when all resistors are firing, will lead to a much higher voltage at a single firing resistor. Of course, this can be compensated for by substantial pulse width truncation to achieve controlled energy, but beyond a certain point, the resistor is unable to reliably withstand the power transmitted, as discussed above.

Therefore, the factory calibration determines Vop by firing all nozzles of all quadrants, and stepping Vpp up until the highest turn on voltage quadrant just truncates. Voltage is stepped down one increment, and this voltage is written as Vop to the memory chip in the pen cartridge. With the memory chip thus programmed, the cartridge may be delivered to a user, either in conjunction with a printer, or as a replacement cartridge.

When installed in a printer by the user, the printer will perform a test on the pen cartridge to determine the correct power supply voltage Vps for that pen. First, the printer reads the operating voltage Vop from the pen's memory chip, and sets Vps=Vop. Then, the printer operates with all nozzles of all quadrants firing, in blackout mode, and reads the pulse width truncation flags for each quadrant. The power supply voltage Vps is stepped up until all quadrants are truncating, and defines that voltage as Vtrunc. Then, the processor calculates the amount by which Vtrunc (the voltage needed to operate under blackout conditions) exceeds Vop. If this difference is below an acceptable limit stored ion the printer controller, Vps is lowered by a single increment below Vtrunc, and the printer operated at this voltage.

If the (Vtrunc–Vps) difference exceeds the preselected limit, the pen reliability may be jeopardized by further operation, and the printer generates a fault message advising the user to reinstall the pen cartridge. If the unexpected resistance leading to the excessive Vtrunc was due to a bad contact between printer and cartridge, such as by a particle between contact pin and contact pad, the reinstallation is likely to cure the problem. If reinstallation does not solve the problem, a fault message advises servicing the printer, and may disable printer operation to prevent damage.

Further details on the calibration process are described in the co-pending and commonly assigned applications by Corrigan et al. entitled "Thermal Ink Jet Print Head and Printer Energy Control Apparatus and Method" and by Wade entitled "Energy Control Method for an Inkjet Print Cartridge", both of which have been heretofore incorporated by reference in their entirety. How the present invention makes calibration connections to the print cartridge 12 will be discussed subsequently.

Figure 4A:
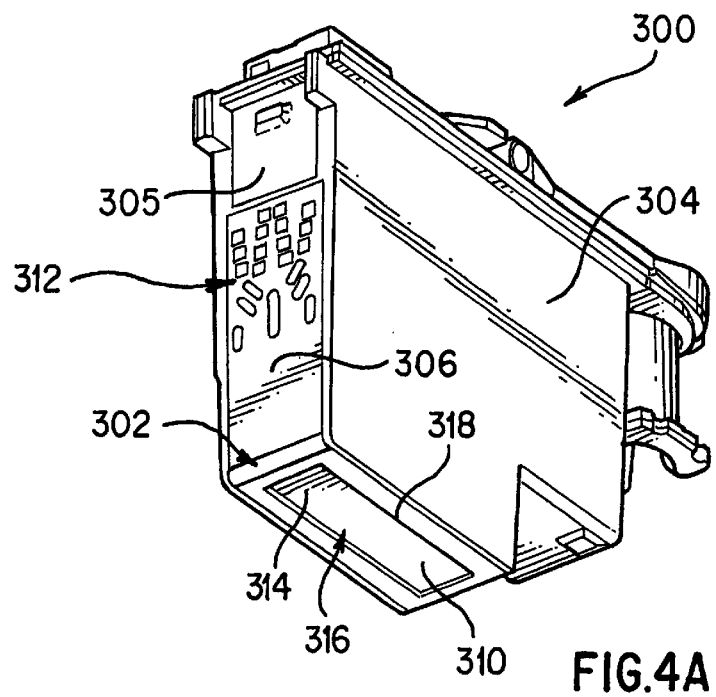
FIG. 4A is a perspective view of a print cartridge containing the printhead die of FIG. 4.
Figure 5A:
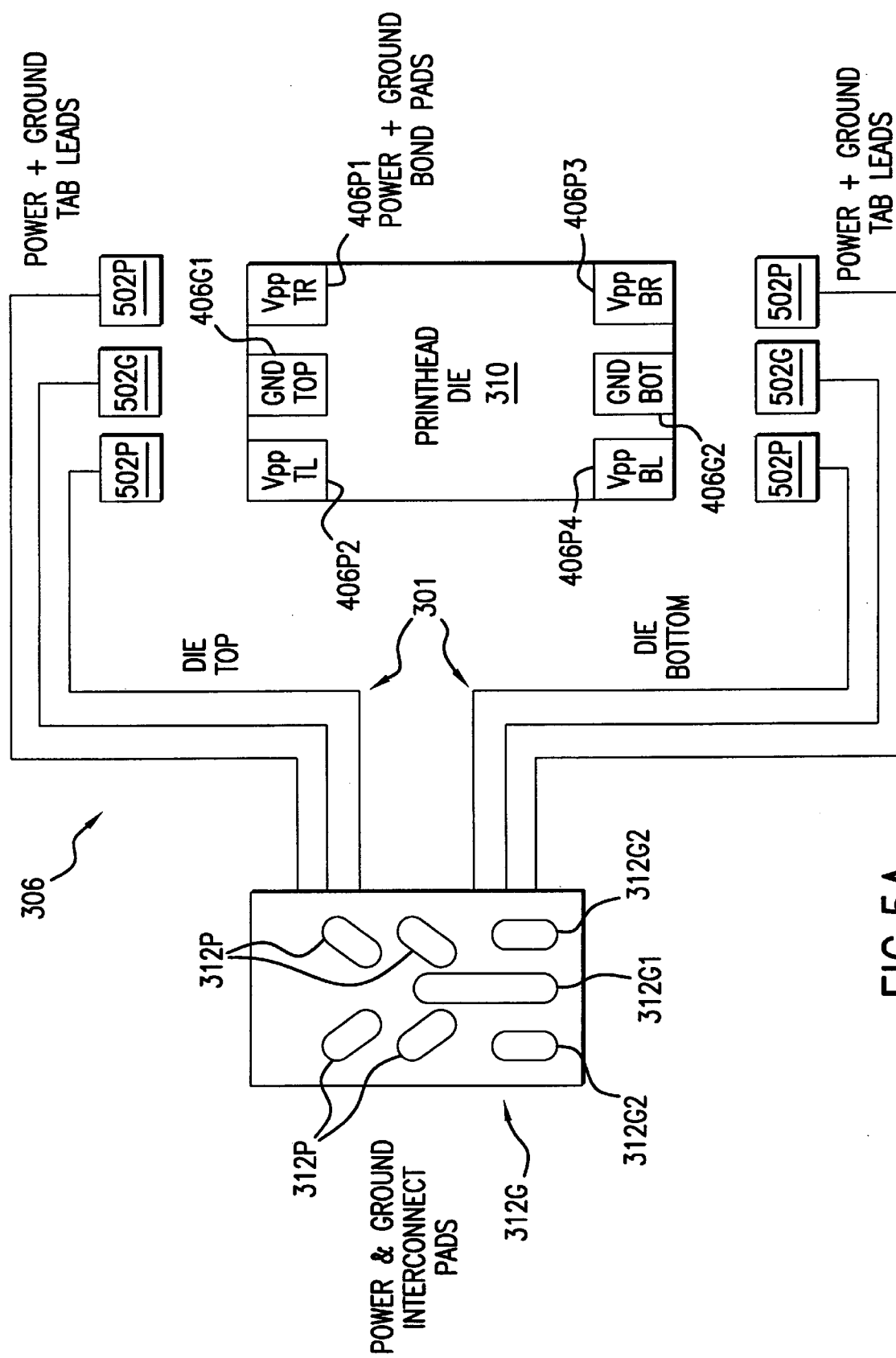
FIG. 5A is a schematic view of the interconnections between the printhead die of FIG. 4B and a flex circuit according to the present invention.

Considering now a presently preferred embodiment of the present invention with reference to FIGS. 4A and 5A, a printhead assembly (also known as a print cartridge) 300 is comprised of a thermal inkjet head assembly (also known as a tab head assembly or a "THA"), indicated generally at 302, a printhead body 304, and a printhead memory device 305. The thermal inkjet head assembly 302 includes an interconnection circuit 306 which is preferably a flex circuit (also known as a Tape Automated Bonding, or "TAB", assembly) 306 of flexible material having electrically conductive traces 301 and electrically conductive interconnect contact pads 312 fabricated thereon, and a printhead die (also known as a processing driver head) 310. The flex circuit 306 and interconnect pads 312 are suitably secured to the print cartridge 300 by, for example, an adhesive material. The interconnect pads 312 align with and electrically contact electrodes (not shown) on carriage 40.

The printhead die 310 comprises a distributive processor 314 (also known as a data processor) preferably integrated with a nozzle member 316 (also known as a driver head). The distributive processor 314 preferably includes digital circuitry and communicates via electrical signals with the print controller 14, nozzle member 316 and various analog devices, such as temperature sensors (not shown), which can be located on the nozzle member 316. The distributive processor 314 processes the signals for precisely controlling firing, timing, thermal and energy aspects of the printhead assembly 300 and nozzle member 316. The nozzle member 316 preferably contains plural orifices or nozzles 318, which can be created by, for example, laser ablation, for creating ink drop generation on a print media.

Figure 4B:
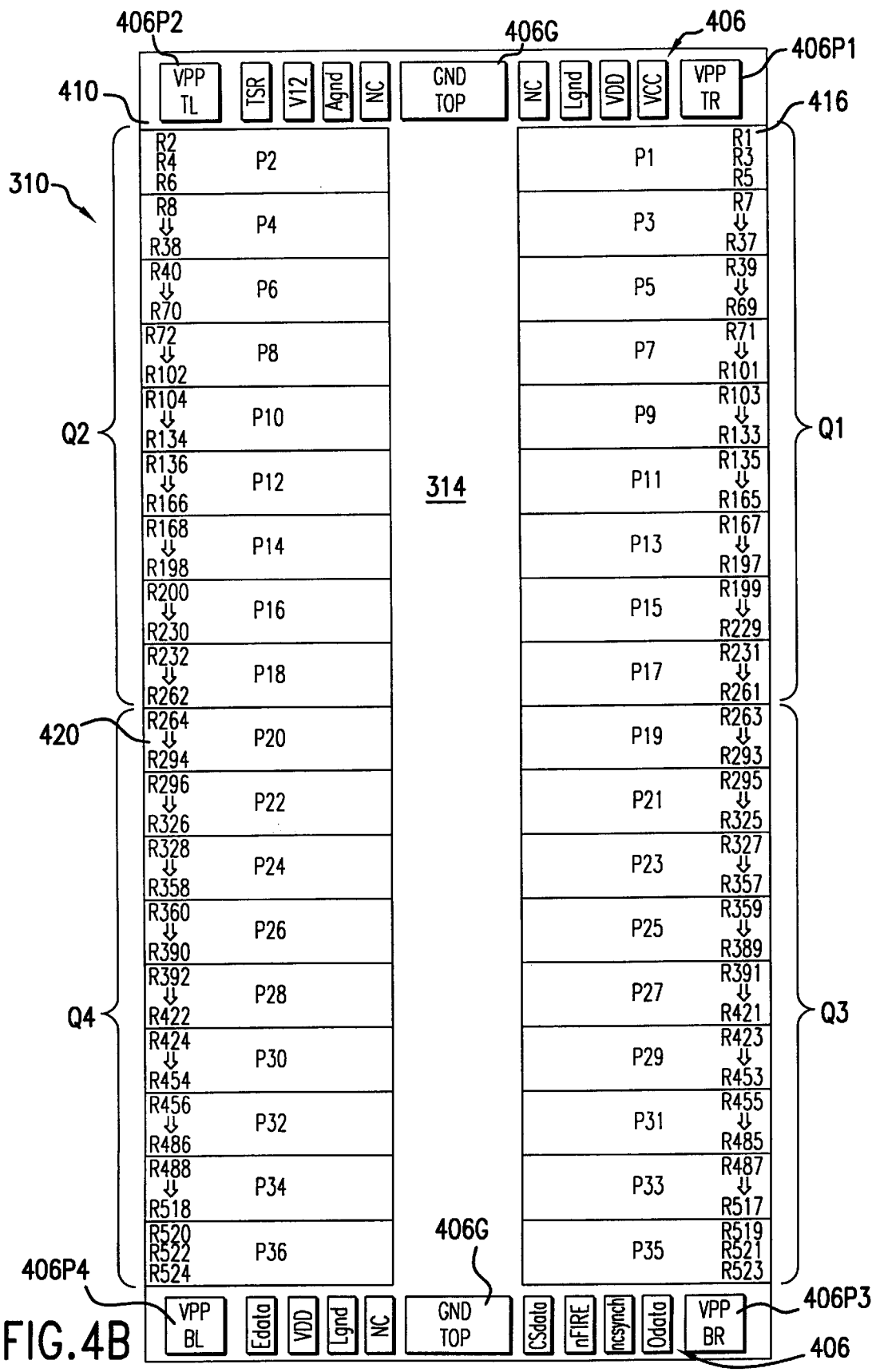
FIG. 4B is a schematic view (in which the elements are not to scale and are exaggerated for simplification) of a printhead die according to a presently preferred embodiment of the present invention.

Considering now another aspect of the presently preferred embodiment of the printhead die 310 with reference to FIGS. 4A, 4B, and 5A, the substrate 410 of the printhead die 310 has ink ejection elements 416 formed thereon which are electrically coupled to the printing system. The print controller 14 and distributive processor 314 provide the ink ejection elements 416 with operational electrical signals. Details of the functions and operation of the distributive processor 314, which are contained in the co-pending and commonly assigned application by Barbour et al. entitled "A High Performance Printing System and Protocol" heretofore incorporated by reference in its entirety, will not be discussed further hereinafter. To conduct the electrical signals to the printhead die 310, and as will be discussed subsequently in greater detail, the print controller 14 and power bus lines 18 are coupled to electrodes or contact points on the carriage 40. Conductive traces are formed on the back of flex circuit 306 and terminate in interconnect pads 312 on the front of the flex circuit 306 which contact the electrodes on the carriage 40 when the print cartridge 300 is installed in the carriage 40. The other ends of the conductive traces are connected to the printhead die 310.

Returning to the printhead die 310, an ink ejection or vaporization chamber (not shown) is adjacent each ink ejection element 416 and preferably located behind a single nozzle (not shown). Also, a barrier layer (not shown) is formed on the surface of the substrate 410 near the vaporization chambers, preferably using photolithographic techniques, and can be a layer of photoresist or some other polymer. A portion of the barrier layer insulates the conductive traces from the underlying substrate 410.

Each ink ejection element 416 acts as an ohmic heater when selectively energized by one or more pulses applied sequentially or simultaneously to one or more of the interconnect pads 312. The ink ejection elements 416 may include heater resistors or piezoelectric elements. The nozzles 318 may be of any size, number, and pattern, and the various figures are designed to simply and clearly show the features of the invention. The relative dimensions of the various features have been greatly adjusted for the sake of clarity.

As best illustrated in FIG. 4B, each ink ejection element 416 is a resistor. Each resistor 416 is allocated to a specific group of resistors, hereinafter referred to as a primitive 420. The processing driver head 310 may be arranged into any number of multiple subsections or ink ejection groups, with each subsection having a particular number of primitives containing a particular number of ink ejection elements 416.

In the exemplary case of FIG. 4B, the processing driver head 310 has 524 nozzles with 524 associated firing resistors. There are preferably thirty-six primitives in two columns of 18 primitives each. The center sixteen primitives in each column have 16 resistors each, while the two end primitives in each column have three resistors each. Thus, the sixteen center primitives have 512 resistors while the four end primitives have 12 resistors, thereby totaling the 524 resistors. The resistors on one side all have odd numbers, starting at the first resistor (R1) and continuing to the third resistor (R3), fifth resistor (R5) and so on. The resistors on the other side all have even numbers, starting at the second resistor (R2) and continuing to the fourth resistor (R4), sixth resistor (R6) and so on. Consequently, the processing driver head 310 is arranged into four similar subsections or quadrants (Q1–Q4) of firing resistors 416 with each quadrant having eight primitives (for example, Q1 has primitives P3–P17) of sixteen resistors each and one primitive (P1) with three resistors (R1, R3, R5).

In a preferred embodiment, the processing driver head 310 is also divided into power subsections for the purpose of power delivery to the resistors 416. The resistors or ink ejection elements 416 in at least one of the ink ejection groups may be selectively actuated by at least one of the power signals supplied over the power bus 18 from the power source 17. Alternatively, at least some of the ink ejection elements 416 in each of the ink ejection groups are selectively actuated by a different one of the power signals.

Figure 6:
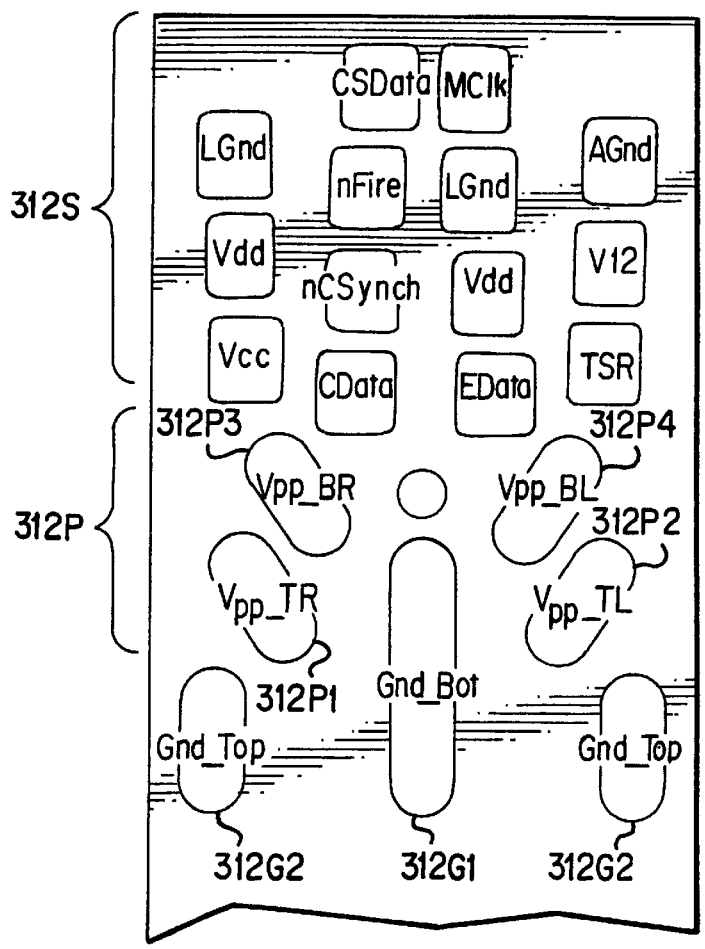
FIG. 6 is a schematic diagram of the interconnect pads on a flex circuit attached to a print cartridge according to the present invention.

As best understood with reference to FIGS. 4B, 5A and 6, the electrical power and control signals for operating the printhead assembly 300, which are supplied to the flex circuit 306 via the interconnect pads 312, are in turn transmitted to the printhead die 310 at pads located on the substrate 410 which mate with the flex circuit 306. Power bond pads 406P among pads 406 are positioned for efficiently delivering power to the power subsections with minimum parasitic energy losses. In the exemplary embodiment depicted by FIG. 4B, each of quadrants Q1 through Q4 is a power subsection, with power bond pads 406P1 to 406P4 providing power to quadrants Q1 to Q4, respectively. By positioning the power bond pads 406P at the four corners (in close proximity or proximate to the power subsections) of the substrate, the power losses through connecting power traces is minimized. Preferably the power bond pads 406P are widened to allow the conduction of relatively high current levels. Preferably even wider ground current return pads 406G are provided for the return current from the power subsections, with a ground pad located between power pads 406P1 and 406P2 carrying return current for quadrants Q1 and Q2 and the other ground pad located between power pads 406P3 and 406P4 carrying return current for quadrants Q3 and Q4. Of course, other power distribution arrangements are possible, such as combining pads 406P1 and 406P2 into one pad, changing the size of the subsections that are powered by particular power pads, etc.

Figure 5B:
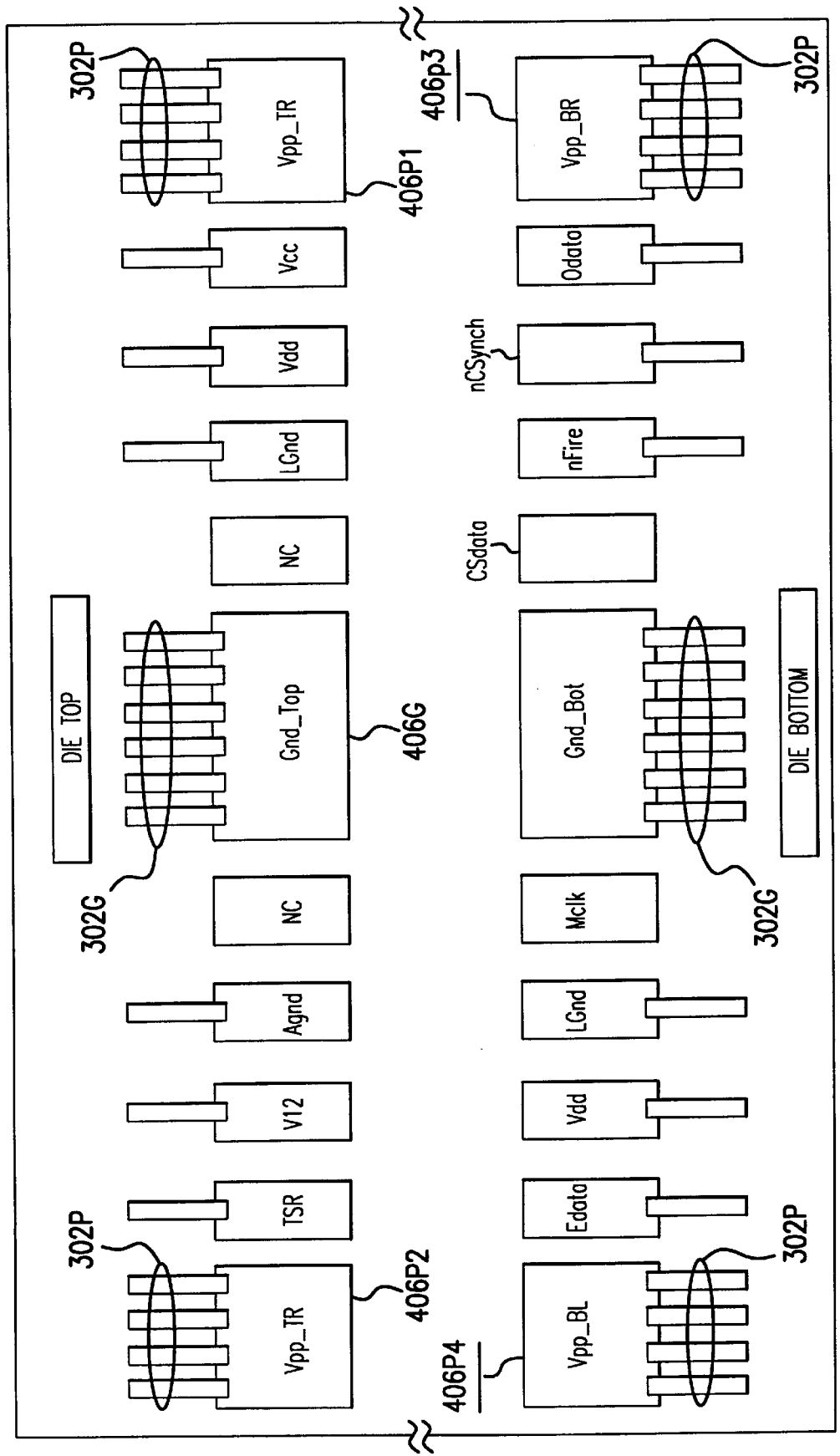
FIG. 5B is a schematic view of the tab leads on the flex circuit of FIG. 5A engaging the printhead die of FIG. 4B.

Considering now the interconnections between the flex circuit and the printhead die in further detail with reference to FIGS. 5A and 5B, which schematically illustrate the electrical connections from the flex circuit 306 to the top and bottom sections of the printhead die 310 which contain the bond pads 406, the flex circuit 306 preferably includes power tab leads 502P fabricated on the flex circuit 306 at locations which electrically contact the power bond pads 406P on the die 310 when the die is affixed to the flex circuit 306. The flex circuit 306 also preferably includes ground tab leads 502G fabricated on the flex circuit 306 at locations which will electrically contact the ground current return pads 406G on the die 310. The flex circuit 306 is preferably a single-sided flex circuit, with the pads 312 fabricated on the front side and the traces 301 fabricated on the back side. Because the traces 301 are all contained on the same side of the flex circuit 306, traces cannot cross over each other as would be possible in a multi-layer design, and so the pads 312 must be arranged on the flex circuit 306 such that no traces 301 cross between the pads 312 and the tab leads 502P,502G. The tab lead interconnects 502P,502G are dimensioned to ensure good electrical contact when the die 310 is mounted to the flex circuit 306. In the preferred embodiment, several power tab leads 502P contact the power bond pads 406P, and several ground tab leads 502G contact the ground current return bond pads 406G. The multiple contacts provide the greater current carrying capacity required for the circuits connected to bond pads 406P, 406G.

Considering now the placement of the interconnect pads 312 on the flex circuit 306, and with reference to FIGS. 4A, 4B, 5A, and 6, the pads 312 are fabricated on the front surface of the flex circuit 306 for contacting mating electrode contact points (not shown) when the print cartridge 300 is mounted in the carriage 40. The signals conducted on the interconnect pads 312 of the preferred embodiment are briefly described in Table I from the perspective of the bond pads 406 of the printhead die 310, and are described in further detail in the co-pending and commonly assigned application by Barbour et al. entitled "A High Performance Printing System and Protocol" heretofore incorporated by reference in its entirety. In the preferred embodiment, a plurality of logic signal pads 312S for commands and data (which will not be discussed further hereinafter) are grouped together, and located on the flex circuit 306 further away from the printhead die 310 and nozzle member 316 than are power interconnect pads 312P and ground interconnect pads 312G. This placement of power interconnect pads 312P and ground interconnect pads 312G closer to the printhead die 310 and nozzle member 316 advantageously minimizes the length of the electrical path through which the power and ground current travel, which in turn reduces internal resistances. The preferred embodiment includes one power pad 312P for each corresponding power bond pad 406P on the printhead die 310, and at least one ground interconnect pad 312G for each corresponding ground bond pad 406G on the printhead die 310 (FIG. 6 illustrates one longer elongated ground interconnect pad 312G1 for connecting to the ground bond pad 406G1 at the die top, and two shorter elongated ground interconnect pads 312G2 for connecting to the ground bond pad 406G2 at the die bottom).

TABLE I

| | Signal Description |
|---|---|
| Die Top | |
| Vpp_TL | The resistor power supply pad for even primitives 2–18 |
| TSR | One end of the Thermal Sense Resisor (the other end connects to Agnd) |
| 12V | The 12V clean power supply for the analog circuitry |
| Agnd | The clean ground for the analog circuitry and return pad for TSR |
| N.C. | (This bond pad is not connected to any circuitry within the die) |
| Gnd_Top | The resistor ground pad for odd primitives 1–17 & even primitives 2–18 |
| N.C. | (This bond pad is not connected to any circuitry within the die) |
| LGnd | Logic ground (connected in metal on the die to Gnd at the die bottom) |
| Vdd | 5V logic supply (connected in metal on the die to Vdd at the die bottom) |
| Vcc | The 12V supply for the driver transistor gate voltage |
| Vpp_TR | The resistor power supply pad for odd primitives 1–17 |
| Die Bottom | |
| Vpp_BL | The resistor power supply pad for even primitives 20–36 |
| Edata | The data input pad for even nozzle data |
| Vdd | 5V logic supply (connected in metal on the die to Vdd at the die top) |
| LGnd | Logic ground (connected in metal on the die to Gnd at the die top) |
| Mclk | The master clock input pad |
| Gnd_Bot | The resistor ground pad for odd primitives 19–35 & even primitives 20–36 |
| Csdata | The Command/Status I/O pad |
| nFire | The resistor fire pulse input pad |
| nCSynch | The column synch signal input pad |

TABLE I-continued

Signal Description

| | |
|---|---|
| Odata | The data input pad for odd nozzle data |
| Vpp_BR | The resistor power supply pad for odd primitives 19–35 |

Figure 7:
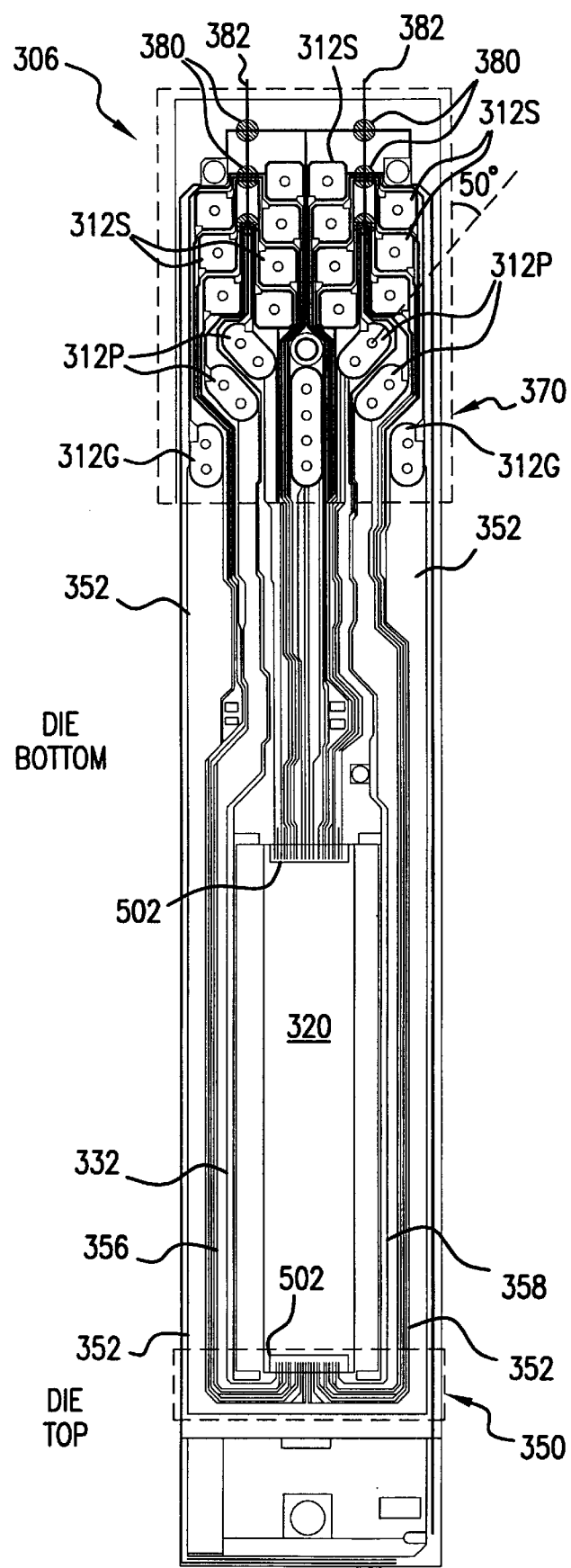
FIG. 7 is a more detailed diagram of the flex circuit of FIG. 6.

Considering now in further detail the layout of the flex circuit 306 with reference to FIG. 7, where the flex circuit 306 is illustrated in an unfolded flat configuration, the circuit 306 preferentially has a plurality of pads 312 fabricated on the front surface including the power interconnect pads 312P and the ground interconnect pads 312G; a plurality of traces fabricated on the back surface; and a plurality of tab leads 502 fabricated on the back surface including the power tab leads 502P and the ground tab leads 502G. A printhead die area 320 is located in a lower portion of the flex circuit 306 and dimensioned such that the printhead die 310 may be mounted in electrical connection to the flex circuit 306. The tab leads 502 are positioned adjacent the die area 320, and spaced around the periphery of a surface of the printhead die 310 when the die 310 is mounted to the flex circuit 306. In a preferred embodiment, the printhead die is substantially rectangular, and has four power tab leads 502P located at the corresponding four corners of the die 310. The preferred embodiment also includes two ground tab leads 502G, each located on the periphery of the surface of the printhead die 310 between the two power tab leads on each of the shorter sides of the die 310. Electrically conductive traces run generally along the length of the flex circuit 306 and connect the pads 312 to the tab leads 502. The power and ground traces (such as a trace 330) that route the power 312P and ground 312G interconnect pads to the die power 502P and ground 502G interconnects carry substantial amounts of current, are thus generally wider so as to minimize the resistance of the trace and avoid excessive waste of power in the form of heat energy. The signal traces (such as a signal trace 332) that route the control and data lines 312S to the tab leads 502 carry relatively lesser current, and thus are generally narrower in width.

Figure 8:
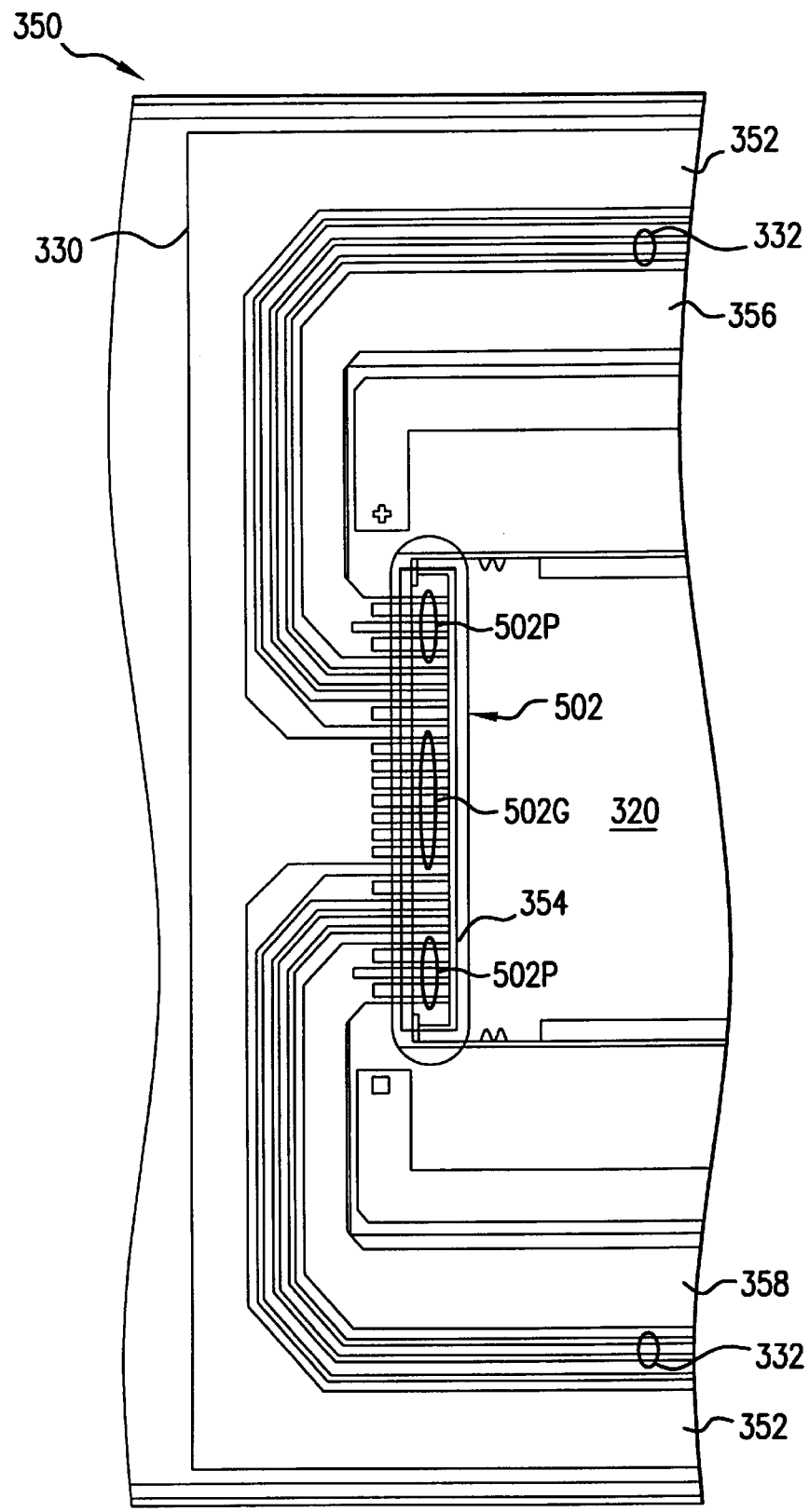
FIG. 8 is a magnified view of a printhead tab lead portion of the flex circuit of FIG. 7.

Considering now in even more detail a printhead die interconnect portion 350 of the flex circuit 306, and with reference to FIG. 8, there is illustrated a plurality of tab leads 502 that connect to the top of the printhead die 310. Gnd_Top traces 352 are connected to the two ground interconnect pads 312G2, and terminate in a ground tab lead 502G for electrically connecting to the corresponding one of the ground bond pads 406G on the printhead die 310. Vpp_TR trace 356 is connected to power interconnect pad 312P1, and terminates in power tab lead 502P1; similarly, Vpp_TL trace 358 is connected to power interconnect pad 312P2, and terminates in power tab lead 502P2. Preferentially, each of die power and ground interconnects 502P,502G includes a plurality of contact fingers, such as a contact finger 354, each contact finger 354 connecting to the printhead die 310 and thus increasing the amount of current that can be transmitted between the flex circuit 306 and the printhead die 310. Alternatively, each of the die power and ground interconnects 502P, 502G may be either a single larger pad sufficient to transmit the required amount of current between the flex circuit 306 and the die 310.

Figure 9:
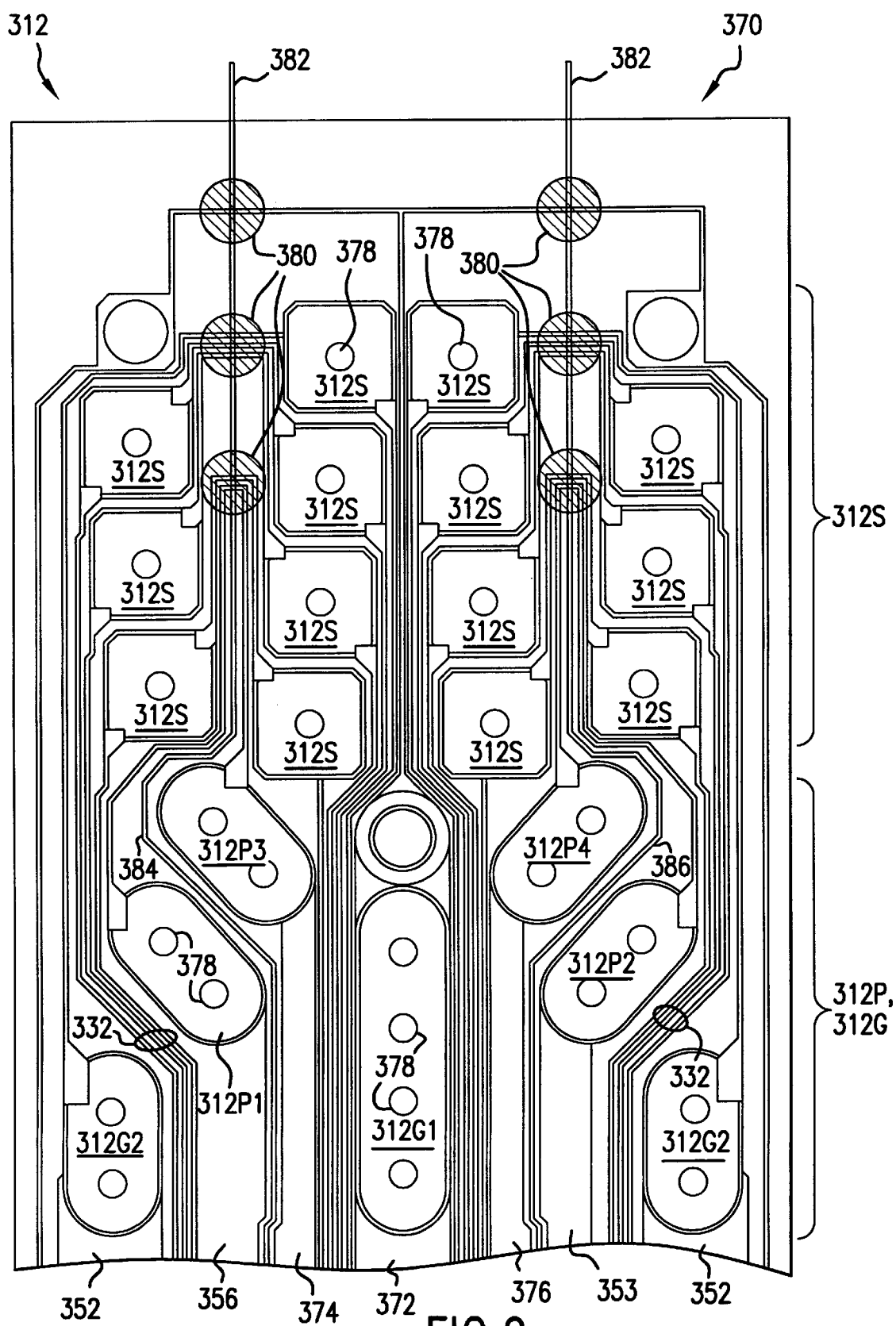
FIG. 9 is a magnified view of an interconnect pad portion of the flex circuit of FIG. 7.

Considering now the layout of an interconnect pad portion 370 of the flex circuit 306 as best seen with reference to FIG. 9, interconnect pads 312 and various traces are arranged on the flex circuit 306. Each power interconnect pad 312P is connected to one of traces 356, 358, 374, 376, and each ground interconnect pad 312G is connected to one of traces 352, 372, for routing to the proper tab lead 502P, 502G. In addition, each power and ground interconnect pad 312P, 312G includes dimpled contacts 378 for accommodating corresponding conductive protrusions or bumps (not shown) on the carriage 40. The construction of a dimpled contact and a corresponding bump contact 378 is known in the art. The bumps 378 and dimples may be switched or mixed between the carriage 40 and the flex circuit 306 without departing from the scope of the present invention. The current carrying capacity of each mating bump 378 and dimple is limited to approximately 1.5 amperes, which is less than the current of approximately 2.25 amperes required to be supplied through each of the lines of the power bus 18 in order to simultaneously fire nine resistors (one per primitive) in each quadrant. By adding additional dimpled contacts 378 to each interconnect pad to mate with additional corresponding carriage bump contacts, the flex circuit 306 accommodates the required current. In a preferred embodiment, each power interconnect pad 312P and shorter ground interconnect pad 312G2 has two dimples and can accommodate twice the current of a single mating bump and dimple; and the longer ground interconnect pad 312G1 has four dimples and thus can accommodate four times the current of a single mating bump and dimple.

Another aspect of the present invention involves fabricating flex circuit traces of different widths in order to equalize parasitic resistances between groups of ink ejection nozzles. By minimizing the difference in parasitic resistances, the energy management circuit 92 can advantageously be made to operate over a smaller range of pulse widths T. As best understood with reference to FIGS. 7 and 9, power traces 374, 376 from power interconnect pads 312P3, 312P4 connect to the die bottom, and thus run for a shorter length on the flex circuit 306 than do power traces 356, 358 from power interconnect pads 312P1, 312P2 which connect to the die top. Narrower traces have higher resistance (as measured between two endpoints) than do wider traces of the same length, while longer traces have higher resistance than shorter traces of the same width. Accordingly, the width of the shorter power traces 374, 376 is reduced relative to the width of the longer power traces 356, 358 in order to produce approximately the same resistance in all traces 356, 358, 374, 376.

Yet another aspect of the present invention involves how connections to the power and ground interconnect pads 312P, 312G are advantageously made during calibration by utilizing the increased pad area allowing for multiple contacts to be made to these pads. The calibration equipment (not shown) mates with one dimpled contact on a pad for supplying current during calibration, and another dimpled contact on the same pad is used to sense the voltage on the pad, independent of the voltage drop due to the contact resistance between the printhead and its driver. This arrangement provides more accurate calibration than if the sensing contact were made at a different location.

Considering now another feature of the interconnect pad portion 370 of the flex circuit 306, the flex circuit 306 also includes six isolation punches 380 arranged in two columns. While most of the interconnect pads 312 are not electrically connected to each other after the flex circuit 306 has been manufactured, during the manufacturing process the pads 312 are electrically interconnected via an isolation punch pattern 382 in order to facilitate gold deposition on the traces of the flex circuit 306 during fabrication, which uses methods well known in the art. One the flex circuit has been fabricated, the isolation punches 380 are punched out, electrically disconnecting the pertinent interconnect pads 312 from each other. The isolation punches 380 also leave some traces on the flex circuit unconnected to any pads 312 or any tab leads 502. Some of these traces are located on the flex circuit 306 between two of the power traces in order to electrically isolate one of the power signals carried on one of the power traces from the other of the power signals carried on the other of the power traces. For example, isolation trace 384 isolates power trace 356 from power trace 374, and isolation trace 386 isolates power trace 358 from power trace 376.

A number of alternative arrangements for delivering ink to the thermal inkjet head assembly 302 are usable with the present invention. Each thermal inkjet head assembly 302 is housed in a cartridge 132a–132d. A cartridge 132a–132d may contain only one thermal inkjet head assembly 302 for one ink color, or it may contain multiple printheads for multiple colors, such as a tricolor cartridge containing three printheads for cyan, magenta, and yellow respectively. As illustrated schematically in FIGS. 10A through 10D, the ink may be supplied to the thermal inkjet head assembly 302 in different ways. In FIG. 10A, an ink reservoir 138a is housed within the print cartridge 132a along with the printhead. In FIG. 10B, an ink reservoir 138b is detachable from the print cartridge 132b, but the reservoir 138b is attached to the print cartridge 132b when they are installed in the carriage 20. In FIG. 10C, the print cartridge 132c does not contain an ink reservoir; ink is supplied to the cartridge 132c instead from an off-chute ink reservoir 138c via a tube 139c. In FIG. 10D, the main ink reservoir 138d is similarly located off-chute and connected to the print cartridge 132d via a tube 139d, but the print cartridge 132d also contains an auxiliary reservoir 138e. The present invention may be utilized with any of these cartridge configurations and ink delivery systems, and with other design alternatives in which the thermal inkjet head assembly 302 and the print media 34 are in relative motion to each other.

Figure 11:
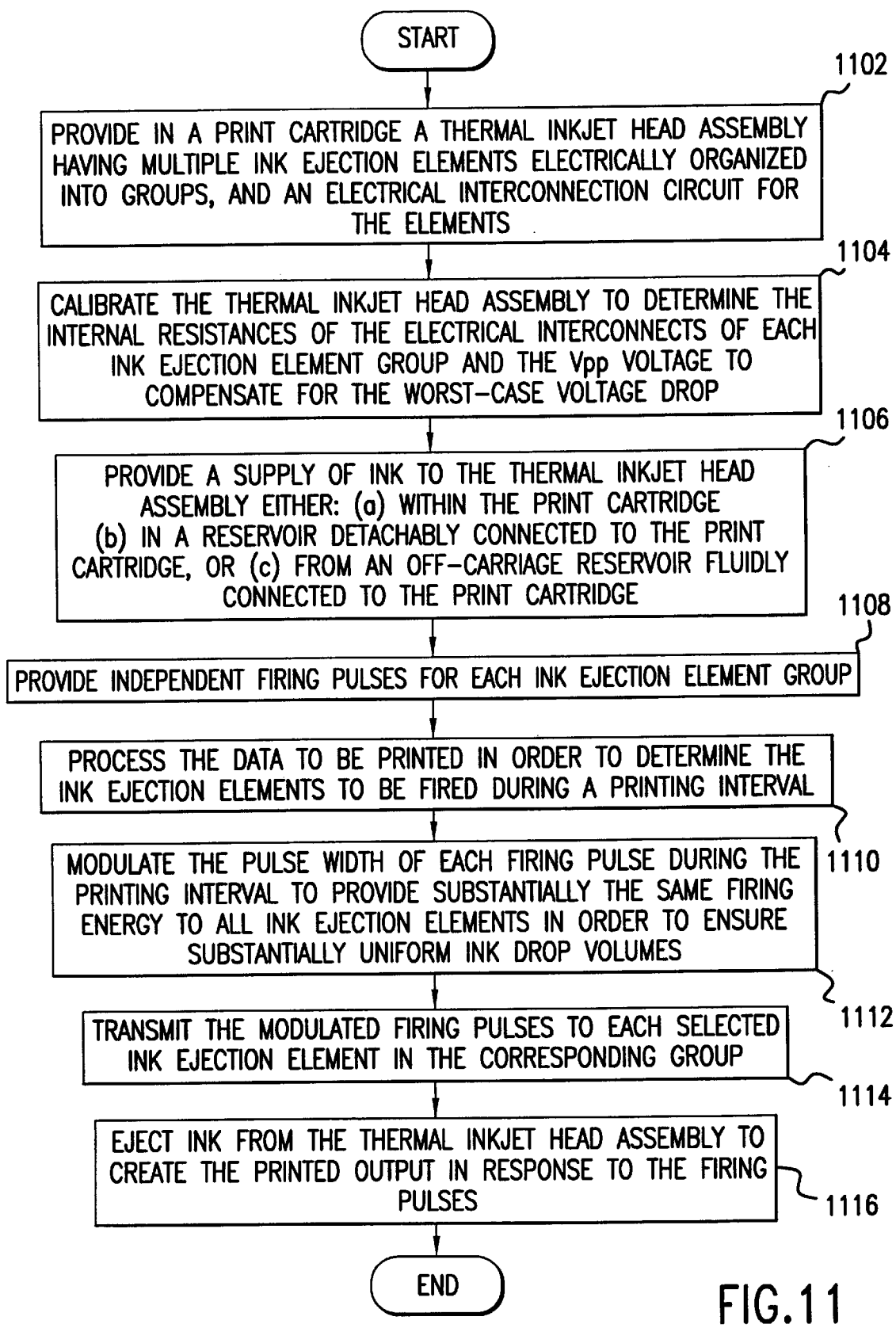
FIG. 11 is a flowchart of a method for supplying power to the printhead circuit of FIG. 3.

Another embodiment of the present invention, as best understood with reference to FIGS. 11, 4A, and 4B, provides a method for supplying power to the printhead circuit. The method begins with a step 1102 in which a thermal inkjet head assembly 302 having multiple ink ejection elements 416 electrically organized into groups of ejection elements (such as quadrants Q1 through Q4) is provided in a print cartridge 300 along with an electrical interconnection circuit 306 that connects the ink ejection elements to power and control signals generated by the printer. In step 1104, the thermal inkjet head assembly 302 is calibrated in order to determine the internal electrical resistances of each group of ink ejection elements 416. As heretofore explained, the results of the calibration are used during printing operations to determine the Vpp voltage level required to compensate for the worst-case voltage drop due to these resistances. In step 1106, a supply of ink is provided to the thermal inkjet head assembly 302. The ink can be supplied in several ways, corresponding to the previously described alternative arrangements for delivering ink. The ink may be contained within a print cartridge 132a; the ink may be contained in a reservoir, such as a reservoir 138c, detachably connected to the print cartridge 132b; or the ink may be supplied from an off-carriage reservoir, such as reservoir 138c, fluidly connected to the print cartridge. In step 1108, a plurality of independently controllable firing pulses for the ink ejection elements 416 are provided, preferably with one firing pulse provided to each element group or quadrant. In step 1110, the data to be printed is processed in order to determine which of the ink ejection elements are to be fired during a particular printing interval. In step 1112, the pulse width of each firing pulse is modulated during the printing interval to provide substantially the same firing energy to all ink ejection elements in order to generate substantially uniform ink drop volumes from all the ink ejection elements which are fired during that interval. In step 1114, the modulated firing pulses are selectively transmitted to each ink ejection element which is to eject ink during the printing interval. This may include transmitting only one of the firing pulses to at least some of the ink ejection elements 416, or may include transmitting only one of the firing pulses to any one group of multiple ink ejection elements 416. In step 1116, ink is ejected from the thermal inkjet head assembly 302 in response to the firing pulses to create the printed output on the print media 34. Following step 1114, the method ends.

From the foregoing it will be appreciated that the printer and method provided by the present invention represents a significant advance in the art. A printer can be constructed according to the present invention so as to deposit uniform ink drop volumes on all portions of the printed media in order to ensure high quality printed output. Although several specific embodiments of the invention have been described and illustrated, the invention is not to be limited to the specific methods, forms, or arrangements of parts so described and illustrated. In particular, the present invention can be incorporated in any thermal inkjet head assembly and printer configuration. The invention may be used with printing systems in which all the components of the printer may not be located in the same physical enclosure. Furthermore, while the invention has been described for purposes of illustration in terms of the printing of inks on print media, the invention is usable for depositing drops of other types of fluids, and depositing them on various types of media other than paper and transparencies. In addition, while a flex circuit has been disclosed as the preferred structure for containing the conductive traces, other similar structures known in the art such as printed circuit boards may be utilized. The invention is limited only by the claims.

What is claimed is:

1. A printing system, comprising:
   a printhead die mounted in the printing system for controllably ejecting drops of an ink, the printhead die including ink ejection elements and a plurality of power bond pads for receiving power signals for controlling the ink ejection elements;
   a conductive circuit having a plurality of power tab leads electrically connected to the power bond pads, and having a plurality of power interconnect pads electrically connected to the power tab leads;
   a power source connected to the power interconnect pads for supplying a power signal to the printhead die; and
   a plurality of energy management circuits each connected to the power signal and to at least some of the ink ejection elements, at least some of the circuits adjustable during operation for delivering a predetermined firing energy to the ink ejection elements.

2. The printing system of claim 1, wherein the ink ejection elements are organized into at least two ink ejection groups, and wherein at least some of the ink ejection elements in each of the ink ejection groups are selectively actuated by a different one of the energy management circuits.

3. The printing system of claim 2, wherein each of the power interconnect pads has at least one contact point through which a current from one of the plurality of power signals is supplied.

4. The printing system of claim 3, wherein a specified amount of current can be supplied through one contact point, and wherein at least some of the power interconnect pads have at least two contact points through which double the specified amount of current can be supplied to an individual ink ejection element group of the printhead die.

5. The printing system of claim 2, wherein the printing system has parasitic resistances in each electrically conductive path from the power source to each ink ejection group, and wherein the energy management circuit compensates for the parasitic resistances so as to eject ink drops of substantially uniform volume from most of the ink ejection elements.

6. The printing system of claim 1, wherein the printhead die further includes at least one ground bond pad, and wherein the conductive circuit further includes at least one ground interconnect pad electrically connected to a corresponding at least one ground tab lead, the at least one ground tab lead electrically connected to the corresponding at least one ground bond pad for carrying return current for the power signals.

7. The printing system of claim 6, wherein a specified amount of current can be supplied through one contact point, and wherein at least one of the ground interconnect pads has at least four contact points through which quadruple the specified amount of return current can be returned from the printhead die to the power source.

8. The printing system of claim 1, wherein at least some of the energy management circuits are fabricated on the printhead die.

9. A printing system, comprising:
   a printhead die mounted in the printing system for controllably ejecting drops of an ink, the printhead die including ink ejection elements and a plurality of power bond pads for receiving power signals for controlling the ink ejection elements;
   a conductive circuit having a plurality of power tab leads electrically connected to the power bond pads, and having a plurality of power interconnect pads electrically connected to the power tab leads;
   a power source connected to the power interconnect pads for supplying a power signal to the printhead die;
   a plurality of energy management circuits each connected to the power signal and to at least some of the ink ejection elements, at least some of the circuits adjustable for delivering a predetermined firing energy to the ink ejection elements;
   wherein the ink ejection elements are organized into at least two ink ejection groups, and wherein at least some of the ink ejection elements in each of the ink ejection groups are selectively actuated by a different one of the energy management circuits;
   wherein each of the power interconnect pads has at least one contact point through which a current from one of the plurality of power signals is supplied; and
   wherein at least some of the power interconnect pads have at least two contact points, one contact point for supplying the current during a calibration operation, and another contact point for sensing a pad voltage during the calibration operation.

10. A printing system, comprising:
    a printhead die mounted in the printing system for controllably ejecting drops of an ink, the printhead die including ink ejection elements and a plurality of power bond pads for receiving power signals for controlling the ink ejection elements;
    a conductive circuit having a plurality of power tab leads electrically connected to the power bond pads, and having a plurality of power interconnect pads electrically connected to the power tab leads;
    a power source connected to the power interconnect pads for supplying a power signal to the printhead die;
    a plurality of energy management circuits each connected to the power signal and to at least some of the ink ejection elements, at least some of the circuits adjustable for delivering a predetermined firing energy to the ink ejection elements; and
    wherein the power tab leads are spaced around the periphery of a surface of the printhead die.

11. The printing system of claim 10, wherein the surface of the printhead die is substantially rectangular, and wherein four power tab leads are located at the corresponding four corners of the printhead die.

12. The printing system of claim 11, wherein the conductive circuit further includes two ground tab leads, each ground tab lead located on the periphery of the surface of the printhead die between the two power tab leads on each of the shorter sides.

13. The printing system of claim 11, wherein each of the four power tab leads includes a plurality of contact fingers for electrically connecting to the corresponding one of the power bond pads on the printhead die.

14. A printing system, comprising:
    a printhead die mounted in the printing system for controllably ejecting drops of an ink, the printhead die including ink ejection elements and a plurality of power bond pads for receiving power signals for controlling the ink ejection elements;
    a conductive circuit having a plurality of power tab leads electrically connected to the power bond pads, and having a plurality of power interconnect pads electrically connected to the power tab leads;
    a power source connected to the power interconnect pads for supplying a power signal to the printhead die;
    a plurality of energy management circuits each connected to the power signal and to at least some of the ink ejection elements, at least some of the circuits adjustable for delivering a predetermined firing energy to the ink ejection elements;
    wherein the ink ejection elements are organized into at least two ink ejection groups, and wherein at least some of the ink ejection elements in each of the ink ejection groups are selectively actuated by a different one of the energy management circuits;
    wherein the printing system has parasitic resistances in each electrically conductive path from the power source to each ink ejection group, and wherein the energy management circuit compensates for the parasitic resistances so as to eject ink drops of substantially uniform volume from most of the ink ejection elements; and
    wherein the parasitic resistance of each electrically conductive path varies with the number of ink ejection elements ejecting ink drops during a printing interval, and wherein the energy management circuit dynamically compensates for the parasitic resistances during different printing intervals so as to eject ink drops of substantially uniform volume from most of the ink ejection elements during most of the printing intervals.

15. A printing system, comprising:
    a printhead die mounted in the printing system for controllably ejecting drops of an ink, the printhead die including ink ejection elements and a plurality of power bond pads for receiving power signals for controlling the ink ejection elements;

a conductive circuit having a plurality of power tab leads electrically connected to the power bond pads, and having a plurality of power interconnect pads electrically connected to the power tab leads;

a power source connected to the power interconnect pads for supplying a power signal to the printhead die;

a plurality of energy management circuits each connected to the power signal and to at least some of the ink ejection elements, at least some of the circuits adjustable for delivering a predetermined firing energy to the ink ejection elements;

wherein the ink ejection elements are organized into at least two ink ejection groups, and wherein at least some of the ink ejection elements in each of the ink ejection groups are selectively actuated by a different one of the energy management circuits;

wherein the printing system has parasitic resistances in each electrically conductive path from the power source to each ink ejection group, and wherein the energy management circuit compensates for the parasitic resistances so as to eject ink drops of substantially uniform volume from most of the ink ejection elements; and wherein a certain current is drawn from the power source to eject ink from an individual ink ejection element, wherein a variable number of the ink ejection elements in one of the ink ejection groups are selectively actuated during a printing interval, and wherein the energy management circuit dynamically compensates during different printing intervals for a voltage drop caused by the certain current flowing though the parasitic resistances in the electrically conductive paths for all selectively actuated ink ejection elements in the one of the ink ejection groups, so as to eject ink drops of substantially uniform volume from the selectively actuated ink ejection elements during the different printing intervals.

16. The printing system of claim 15, wherein the voltage drop varies by a factor of up to 9:1 depending on the variable number of the ink ejection elements selectively actuated during a printing interval.

17. A printing system, comprising:

a printhead die mounted in the printing system for controllably ejecting drops of an ink, the printhead die including ink ejection elements and a plurality of power bond pads for receiving power signals for controlling the ink ejection elements;

a conductive circuit having a plurality of power tab leads electrically connected to the power bond pads, and having a plurality of power interconnect pads electrically connected to the power tab leads;

a power source connected to the power interconnect pads for supplying a power signal to the printhead die;

a plurality of energy management circuits each connected to the power signal and to at least some of the ink ejection elements, at least some of the circuits adjustable for delivering a predetermined firing energy to the ink ejection elements; and wherein each of the energy management circuits delivers the predetermined firing energy by adjusting a pulse width of a corresponding firing pulse.

18. A printing system, comprising:

a printhead die mounted in the printing system for controllably ejecting drops of an ink, the printhead die including ink ejection elements and a plurality of power bond pads for receiving power signals for controlling the ink ejection elements;

a conductive circuit having a plurality of power tab leads electrically connected to the power bond pads, and having a plurality of power interconnect pads electrically connected to the power tab leads;

a power source connected to the power interconnect pads for supplying a power signal to the printhead die;

a plurality of energy management circuits each connected to the power signal and to at least some of the ink ejection elements, at least some of the circuits adjustable for delivering a predetermined firing energy to the ink ejection elements; and wherein each of the energy management circuits delivers the predetermined firing energy by adjusting an output slope of a corresponding voltage-to-power converter circuit.

19. An inkjet printing apparatus, comprising:

a rectangular elongated printhead die having a plurality of ink ejection elements formed thereon, the printhead die having four corner portions and two end portions, each end portion located along opposite shorter edges of the printhead die and between a different two of the corner portions; and a conductive circuit mounted to the printhead die, the conductive circuit having power and ground traces thereon for providing power but not firing signals to the printhead die, wherein the power traces connect to the printhead die within the four corner portions, and wherein the ground traces connect to the printhead die within the two end portions.

* * * * *